US009966964B1

(12) United States Patent
Meninger et al.

(10) Patent No.: US 9,966,964 B1
(45) Date of Patent: May 8, 2018

(54) MULTI-PHASE DIVIDER

(71) Applicant: Cavium, Inc., San Jose, CA (US)

(72) Inventors: Scott E. Meninger, Groton, MA (US); JingDong Deng, Acton, MA (US)

(73) Assignee: Cavium, Inc., San Jose, CA (US)

( * ) Notice: Subject to any disclaimer, the term of this patent is extended or adjusted under 35 U.S.C. 154(b) by 0 days. days.

(21) Appl. No.: 15/602,774

(22) Filed: May 23, 2017

(51) Int. Cl.
*H03B 19/00* (2006.01)
*H03L 7/18* (2006.01)
*H03K 3/037* (2006.01)

(52) U.S. Cl.
CPC .............. *H03L 7/18* (2013.01); *H03K 3/037* (2013.01)

(58) Field of Classification Search
CPC ................................. H03L 7/18; H03K 3/037
USPC ............... 327/113–115, 117, 118, 291–296; 377/47, 48
See application file for complete search history.

(56) References Cited

U.S. PATENT DOCUMENTS

| 6,356,123 B1* | 3/2002 | Lee ..................... H03K 5/13 327/115 |
| 6,583,674 B2* | 6/2003 | Melava ................ H03K 23/68 327/115 |
| 7,323,913 B1* | 1/2008 | Kossel ................ H03K 23/00 327/115 |
| 2005/0258883 A1* | 11/2005 | Farjad-Rad ............ G06F 1/04 327/295 |
| 2006/0119408 A1* | 6/2006 | Chan ..................... G06F 1/04 327/291 |
| 2009/0296878 A1* | 12/2009 | Tsai ................... H03K 23/667 377/47 |

\* cited by examiner

*Primary Examiner* — Thomas Skibinski
(74) *Attorney, Agent, or Firm* — Hamilton, Brook, Smith & Reynolds, P.C.

(57) ABSTRACT

An example embodiment disclosed herein enables at least one frequency divider chain of a multiphase divider circuit to ensure proper phase relations after multiple frequency divisions. Another example embodiment enables a unique reset sequence to maximize a timing margin for reset signals of the at least one frequency divider chain and, thus, maximizes a bandwidth of the multiphase divider circuit.

28 Claims, 13 Drawing Sheets

MULTI-PHASE DIVIDER

BACKGROUND

Clock signals are used for timing or synchronizing operations within many electronic devices. Various applications may employ clock signals that are multiphase clock signals, also referred to interchangeably herein as multiphase signals. A multiphase signal is defined as a set of sinusoidal or rectangular signals with individual signal components having equally spaced phase differences and a monotonic increase of phase when going from one signal to a next one.

Multiphase signals may be used, for example, for timing or synchronizing read and write operations for memories, such as double-data-rate (DDR) memories, for timing or synchronizing data transfer operations to perform a Serializer/Deserializer (SerDes) function, or for any other suitable application. Multiphase signals are often generated by multi-tap ring oscillators and may need to be divided down to produce desired frequencies for a particular application.

SUMMARY

According to an example embodiment, a multiphase divider circuit may comprise at least one frequency divider chain. Each frequency divider chain of the at least one frequency divider chain may be composed of a respective plurality of differential frequency dividers and configured to receive a respective input pair of input signals of a plurality of input signals with respective input phases of an initial set of input phases, the plurality of input signals received by the multiphase divider circuit. Each frequency divider chain of the at least one frequency divider chain may be configured to produce a respective output pair of output signals by performing multiple frequency divisions of the respective input pair of input signals via the respective plurality of differential frequency dividers. One or more frequency divider chains of the at least one frequency divider chain may be configured to include at least one phase inversion. The at least one phase inversion may be located along the one or more frequency divider chains to produce the respective output pair of output signals with respective output phases from within the initial set of input phases.

Each differential frequency divider of each respective plurality of differential frequency dividers may be a divide-by-two differential frequency divider.

Each respective input pair may be a respective input pair of complementary input signals and each respective output pair may be a respective output pair of complementary output signals.

The at least one phase inversion may be implemented by cross-connecting a) differential output terminals of a given differential frequency divider of the respective plurality of differential frequency dividers, with b) differential input terminals of a successive differential frequency divider of the respective plurality of differential frequency dividers.

The at least one phase inversion may prevent the successive differential frequency divider from producing a differential output signal from its positive output terminal with a divided output phase that is outside of the initial set of input phases.

Each differential frequency divider of each respective plurality of differential frequency dividers may be configured to (i) be clocked via a rising edge of a differential input signal to its positive input terminal, (ii) produce a first differential output signal from its positive output terminal with half a number of phases relative to the differential input signal, and (iii) produce a second differential output signal from its negative output terminal, wherein the second differential output signal is a complementary signal of the first differential output signal.

Each frequency divider chain of the at least one frequency divider chain may be resettable.

The at least one frequency divider chain may include a first frequency divider chain, a second frequency divider chain, and a third frequency divider chain. The multiphase divider circuit may further comprise a reset signal generator. The reset signal generator may be configured to receive an external reset signal, produce a first synchronized reset signal, derived from the external reset signal, and produce a second synchronized reset signal, derived from the first synchronized reset signal. The first frequency divider chain may be configured to be reset by the first synchronized reset signal. The second divider chain and the third divider chain may be configured to be reset by the second synchronized reset signal.

A starting differential frequency divider of the first frequency divider chain may be configured to receive a given input signal of the plurality of input signals at its positive input terminal and the first synchronized reset signal may be synchronized to the given input signal.

The reset signal generator may include dual back-to-back flip-flops (FFs). The dual back-to-back FFs may include a first flip-flop (FF) and a second FF. The first FF may be configured to receive the external reset signal. The first FF and the second FF may be configured to be clocked by the given input signal. The second FF may be configured to produce the first synchronized reset signal.

The starting differential frequency divider may be a first starting differential frequency divider, the given input signal may be a first given input signal, and the reset signal generator may further include a third FF. The third FF may be configured to receive the first synchronized reset signal and to be clocked by a second given input signal of the plurality of input signals to produce the second synchronized reset signal. A second starting differential frequency divider of the third divider chain may be configured to receive the second given input signal at its positive input terminal.

The reset signal generator may be further configured to maximize a timing margin between rising edges of the first synchronized reset signal and the second synchronized reset signal.

The reset signal generator may be configured to maximize the timing margin by synchronizing the external reset signal with a first input signal of the plurality of input signals to produce the first synchronized reset signal used to reset the first divider chain and synchronizing the first synchronized reset signal with a second input signal of the plurality of input signals to produce the second synchronized reset signal used to reset the second divider chain and the third divider chain.

The timing margin may be two-thirds of a clock period of the first input signal. A first starting differential divider of the first divider chain may be configured to receive the first input signal at its positive input terminal and a second starting differential divider of the third divider chain may be configured to receive the second input signal at its positive input terminal.

According to another example embodiment, a method for dividing a multiphase input signal by a multiphase divider circuit may comprise receiving, at each frequency divider chain of at least one frequency divider chain of the multiphase divider circuit, a respective input pair of input signals of a plurality of input signals with respective input phases of an initial set of input phases. The plurality of input signals may compose the multiphase input signal. Each frequency divider chain of the at least one frequency divider chain may be composed of a respective plurality of differential frequency dividers. The method may comprise producing a respective output pair of output signals from each frequency divider chain by performing multiple frequency divisions of the respective input pair of input signals via the respective plurality of differential frequency dividers and including at least one phase inversion in one or more frequency divider chains of the at least one frequency divider chain. The at least one phase inversion may be located along the one or more frequency divider chains for producing the respective output pair of output signals with respective output phases from within the initial set of input phases.

Including the at least one phase inversion may include implementing the at least one phase inversion by cross-connecting a) differential output terminals of a given differential frequency divider of the respective plurality of differential frequency dividers, with b) differential input terminals of a successive differential frequency divider of the respective plurality of differential frequency dividers.

Implementing the at least one phase inversion may prevent the successive differential frequency divider from producing a differential output signal from its positive output terminal with a divided output phase that is outside of the initial set of input phases.

The method may comprise clocking each differential frequency divider of each respective plurality of differential frequency dividers via a rising edge of a differential input signal to its positive input terminal. The method may comprise producing, by each differential frequency divider of each respective plurality of differential frequency dividers, a first differential output signal from its positive output terminal with half a number of phases relative to the differential input signal. The method may comprise producing, by each differential frequency divider of each respective plurality of differential frequency dividers, a second differential output signal from its negative output terminal, wherein the second differential output signal may be a complementary signal of the first differential output signal.

The at least one frequency divider chain may include a first frequency divider chain, a second frequency divider chain, and a third frequency divider chain. The multiphase divider circuit may further comprise a reset signal generator. The method may comprise receiving an external reset signal at the reset signal generator. The method may comprise producing a first synchronized reset signal by the reset signal generator, the first synchronized reset signal derived from the external reset signal. The method may comprise producing a second synchronized reset signal by the reset signal generator, the second synchronized reset signal derived from the first synchronized reset signal. The method may comprise resetting the first frequency divider chain via the first synchronized reset signal and resetting the second divider chain and the third divider chain via the second synchronized reset signal.

Producing the first synchronized reset signal may include receiving a given input signal of the plurality of input signals at a positive input terminal of a starting differential frequency divider of the first frequency divider chain and synchronizing the first synchronized reset signal to the given input signal.

The reset signal generator may include dual back-to-back flip-flops (FFs). The dual back-to-back FFs may include a first flip-flop (FF) and a second FF. Producing the first synchronized reset signal may include receiving the external reset signal at the first FF, clocking the first FF and the second FF by the given input signal, and producing the first synchronized reset signal at an output of the second FF.

The starting differential frequency divider may be a first starting differential frequency divider, the given input signal may be a first given input signal, the reset signal generator may further include a third FF. Producing the second synchronized reset signal may include receiving a second given input signal of the plurality of input signals at a positive input terminal of a second starting differential frequency divider of the third divider chain, receiving the first synchronized reset signal at the third FF, clocking the third FF by the second given input signal of the plurality of input signal, and producing the second synchronized reset signal at an output of the third FF.

The method may comprise maximizing a timing margin between rising edges of the first synchronized reset signal and the second synchronized reset signal by the reset signal generator.

Maximizing the timing margin may include synchronizing the external reset signal with a first input signal of the plurality of input signals to produce the first synchronized reset signal used to reset the first divider chain and synchronizing the first synchronized reset signal with a second input signal of the plurality of input signals to produce the second synchronized reset signal used to reset the second divider chain and the third divider chain.

The timing margin may be two-thirds of a clock period of the first input signal. Maximizing the timing margin may further include receiving the first input signal at a positive input terminal of a first starting differential divider of the first divider chain and receiving the second input signal at a positive input terminal of a second starting differential divider of the third divider chain.

It should be understood that example embodiments disclosed herein can be implemented in the form of a method, apparatus, or system.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Implementation of a multiphase divider is not as straightforward as it is compared to a case when just having to divide a single-ended signal or a differential signal. Because of a non-well defined initial state, a number of conventional dividers operating in parallel to perform multiphase division may start dividing in such a way that a number of divided output signals may no longer be employed as a valuable multiphase signal as a characteristic of generating such divided output signals having a monotonic increase of equally spaced phases may not be achieved. A challenge of a multiphase divider is to maintain proper phase relations for the divided outputs generated.

According to an example embodiment, a multiphase divider circuit is phase preserving. An example embodiment of configuration of the multiphase divider circuit ensures proper phase relations after multiple frequency divisions. Further, an example embodiment of a unique reset sequence to the multiphase divider circuit maximizes a timing margin for reset signals of the multiphase divider circuit and, thus, maximizes a bandwidth of the multiphase divider circuit, as disclosed further below.

Figure 1:
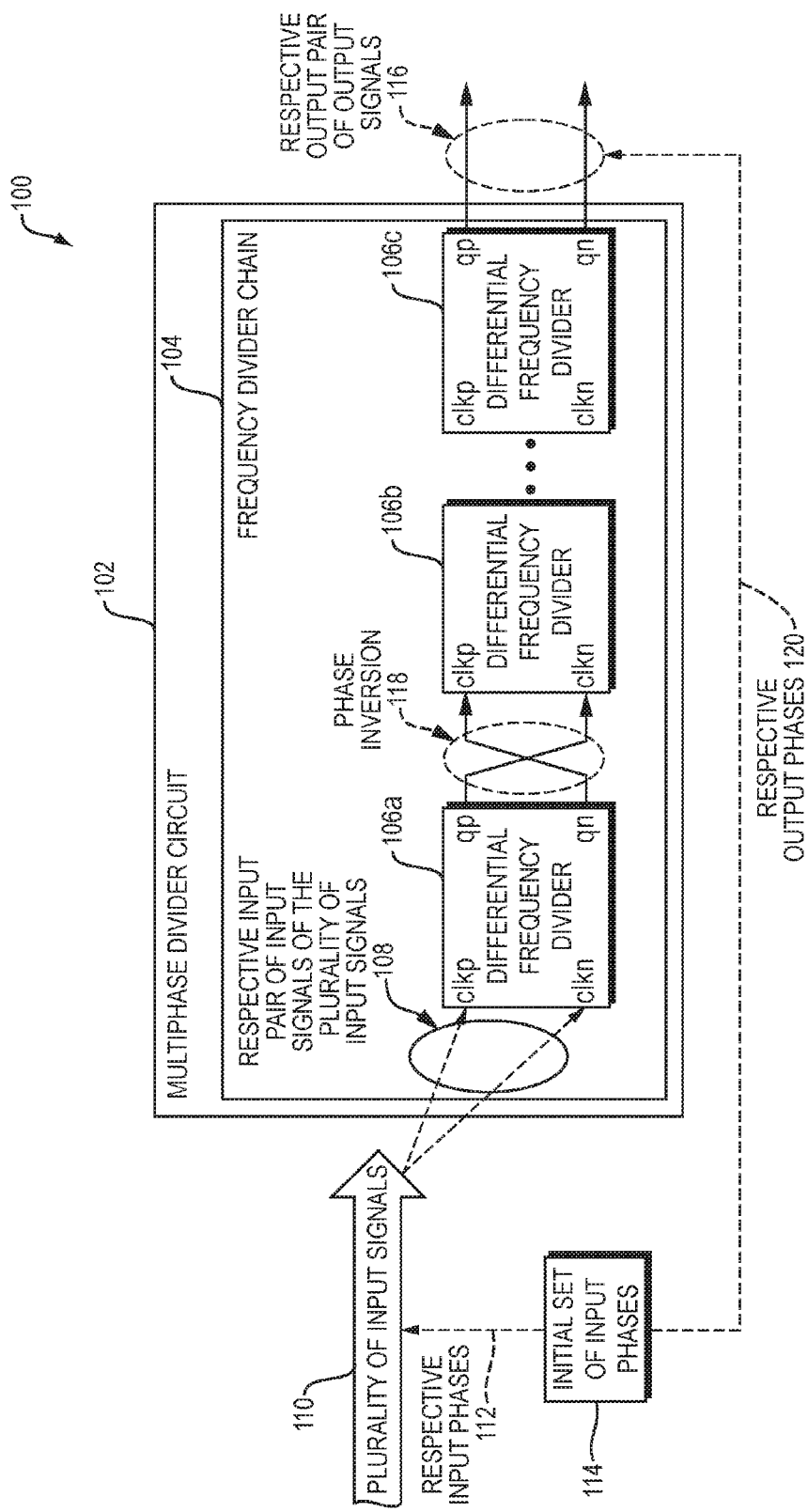
FIG. 1 is a block diagram of an example embodiment of a multiphase divider circuit.

FIG. 1 is a block diagram 100 of an example embodiment of a multiphase divider circuit 102 that is a phase preserving divider circuit. The multiphase divider circuit 102 comprises the frequency divider chain 104. The frequency divider chain 104 is composed of a respective plurality of differential frequency dividers, that is, the differential frequency dividers 106a-c. The multiphase divider circuit 102 is configured to receive a respective input pair of input signals 108 of a plurality of input signals 110 with respective input phases 112 of an initial set of input phases 114. The plurality of input signals 110 are received by the multiphase divider circuit 102. The frequency divider chain 104 is configured to produce a respective output pair of output signals 116 by performing multiple frequency divisions of the respective input pair of input signals 108 via the respective plurality of differential frequency dividers 106a-c. The frequency divider chain 104 is configured to include a phase inversion 118. The phase inversion 118 is located along the frequency divider chain 104 to produce the respective output pair of output signals 116 with respective output phases 120 from within the initial set of input phases 114.

The respective input pair of input signals 108 may include complementary signals that may be input to non-inverting and inverting clock inputs of the differential frequency divider 106a that may be a divide by two differential frequency divider. Each of the differential frequency dividers 106a-c may have its non-inverting differential output (i.e., qp) coupled to its non-inverting differential data input (not shown) and its inverting differential output (i.e., qn) coupled to its inverting differential data input (not shown). The phase inversion 118 may be implemented by cross-connecting differential output terminals of the differential frequency divider 106a with differential input terminals of a successive differential frequency divider with respect to the differential frequency divider 106a, that is, the differential frequency divider 106b in the example embodiment. For example, the non-inverting (i.e., positive) differential data output (i.e., qp) of the differential frequency divider 106a is coupled to the inverting (i.e., negative) clock input of the differential frequency divider 106b, and the inverting (i.e., negative) differential data output (i.e., qn) of the differential frequency divider 106a is coupled to the non-inverting (i.e., positive) clock input of the differential frequency divider 106b.

The plurality of input signals 110 may be individual signals (not shown) of a multiphase signal (not shown) that may need to be divided down based on desired frequencies for a particular application. As such, it should be understood that a number of the differential frequency dividers 106a-c may be more or less than shown, depending upon an amount of division required and a division ratio of a type of differential frequency divider employed. Further, it should be understood that the phase inversion 118 may be located at any suitable location along the frequency divider chain 104 and that more phase inversions may be employed, as disclosed further below.

The multiphase divider circuit 102 may be employed to divide down a multiphase signal that is composed of the plurality of input signals 110. The plurality of input signals 110 may be generated in any suitable way, such as via a differential ring oscillator, as disclosed with reference to FIG. 2A below.

Figure 2A:
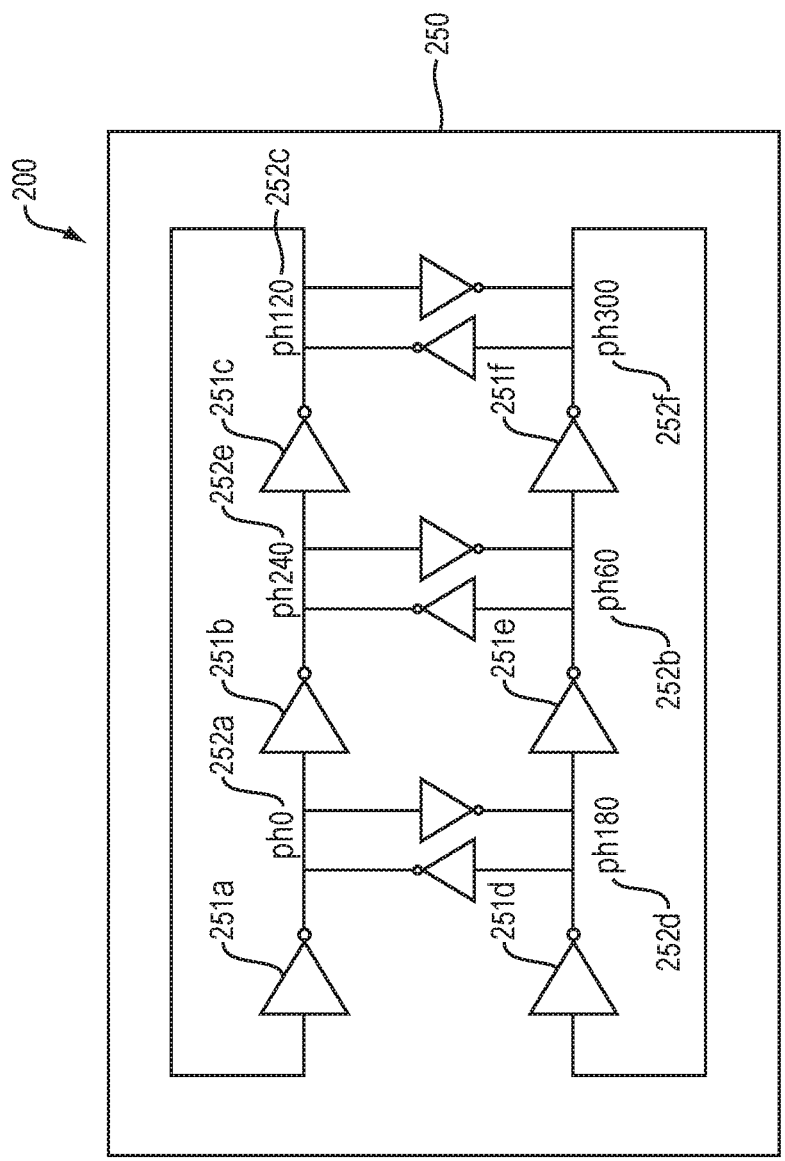
FIG. 2A is a circuit diagram of an example prior art multiphase signal generator.

FIG. 2A is a circuit diagram 200 of an example prior art multiphase signal generator 250. The multiphase signal generator 250 is a differential ring oscillator. The differential ring oscillator includes a ring of N identical delay cells, that is, the 6 identical delay cells 251a-f that each have a delay of $\tau_D$. The oscillation frequency of the differential ring oscillator, that is, the multiphase signal generator 250, is given by $f_{osc}=1/T=1/2N\tau_D$, where T denotes the period of the multiphase signal that is composed of 6 phases output from the 6 identical delay cells 251a-f.

For example, a conventional differential ring oscillator, such as the multiphase signal generator 250, provides N output signals, that is, a respective output from each of the N identical delay cells, each respective output oscillating with $f_{osc}$ and having a phase difference of $2\pi/N$ with respect to its neighboring signal. The total of N signals is termed a multiphase signal as a phase of the individual signals monotonically increases by an equal spacing of $2\pi/N$ when going from one signal to a next one. In terms of time units, phase differences between the individual components (i.e., signals) of the multiphase signal can also be expressed as T/N where T denotes the period of the multiphase signal, as disclosed above.

Figure 2B:
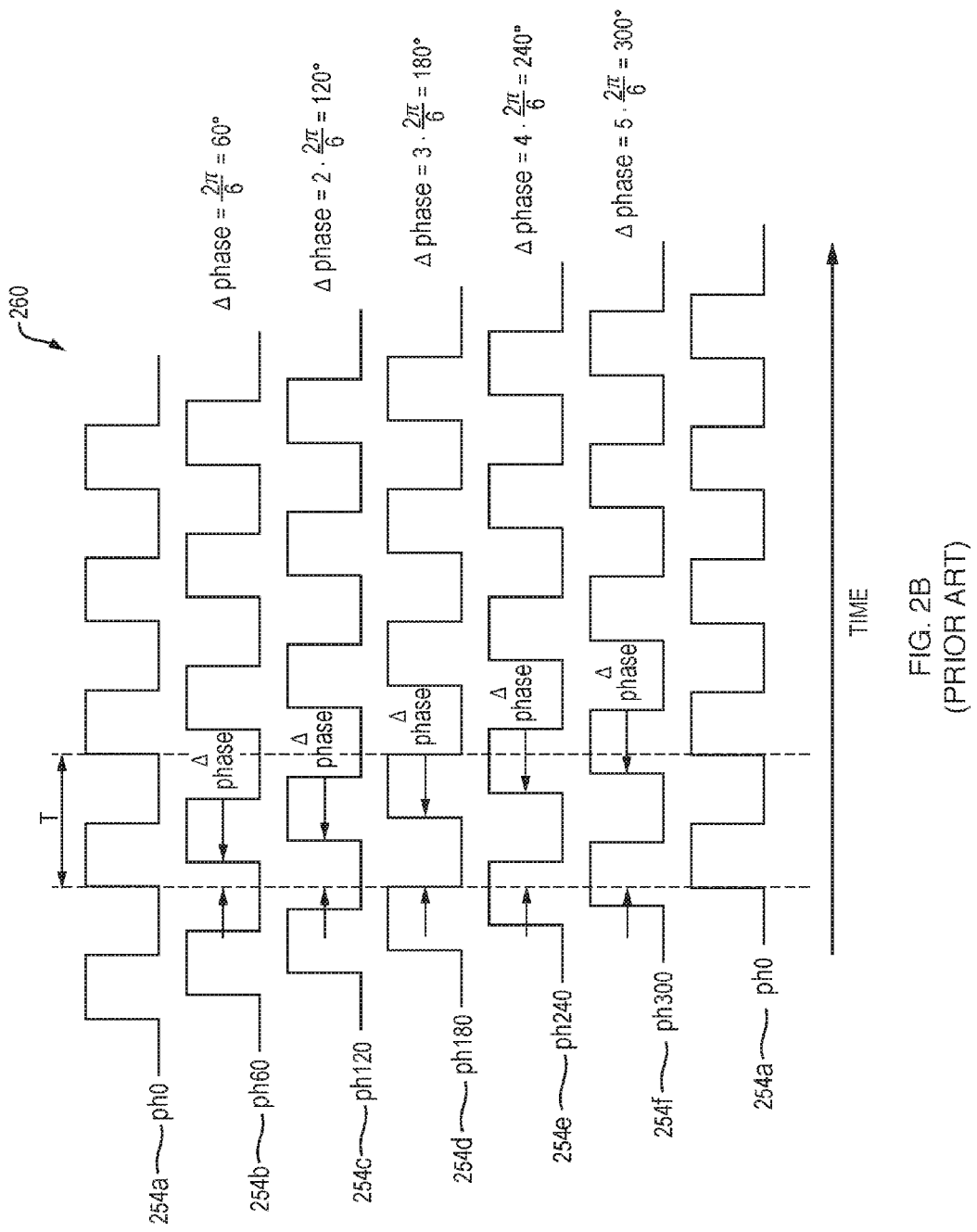
FIG. 2B is a timing diagram of six output phases generated by the example prior art multiphase signal generator of FIG. 2A.

According to the example prior art multiphase signal generator 250 of FIG. 2A, each of the delay cells 251a-f of the multiphase signal generator 250 generates 6 output phases, that is, a first output phase 252a of zero degrees, a second output phase 252b of sixty degrees, a third output phase 252c of one hundred and twenty degrees, a fourth output phase 252d of one hundred and eighty degrees, a fifth output phase 252e of two hundred and forty degrees, and a sixth output phase 254f of three hundred degrees, as shown in FIG. 2B, disclosed below.

FIG. 2B is a timing diagram 260 of the 6 output phases 252a-f generated by the example prior art multiphase signal generator 250 of FIG. 2A. The timing diagram 260 includes plots 254a-f of the 6 output phases 252a-f, respectively. As shown in the timing diagram 260, the phase of the individual signals referred to as the first, second, third, fourth, fifth, and sixth output phases 252a-f monotonically increases by the equal spacing of $2\pi/N$, that is, $2*180°/6$, that is, sixty degrees, when going from one signal to the next one.

The individual signals of a multiphase signal, such as the 6 output phases 252a-f generated by the example prior art multiphase signal generator 250 of FIG. 2A, disclosed above, may need to be divided down by a multiphase divider (also referred to interchangeably herein as a multiphase divider circuit) to produce desired frequencies for a particular application, as disclosed above. A conventional multiphase divider, such as disclosed below with reference to FIG. 3, fails to ensure the proper phase relations for the divided output, as disclosed below.

Figure 3:
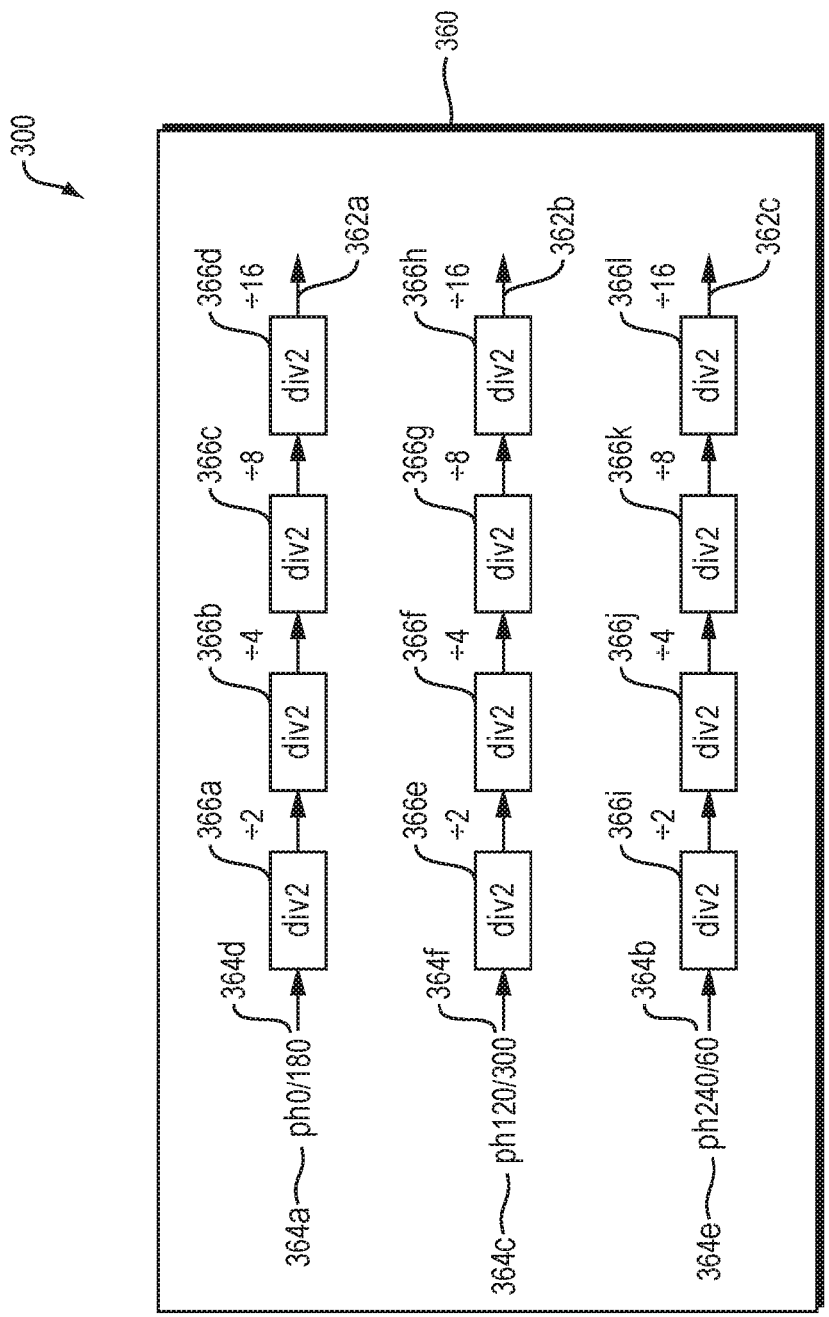
FIG. 3 is a circuit diagram of an example of a prior art multiphase divider circuit.

FIG. 3 is a circuit diagram 300 of an example of a prior art multiphase divider circuit 360. The prior art multiphase divider circuit 360 divides a multiphase signal comprised of 6 phases 264a-f that correspond to the 6 output phases 254a-f of FIG. 2B, disclosed above. The implementation of FIG. 3 has a drawback because phase relations at the outputs 362a-c are uncertain due to unknown initial states of the dividers 366a-1.

Figure 4A:
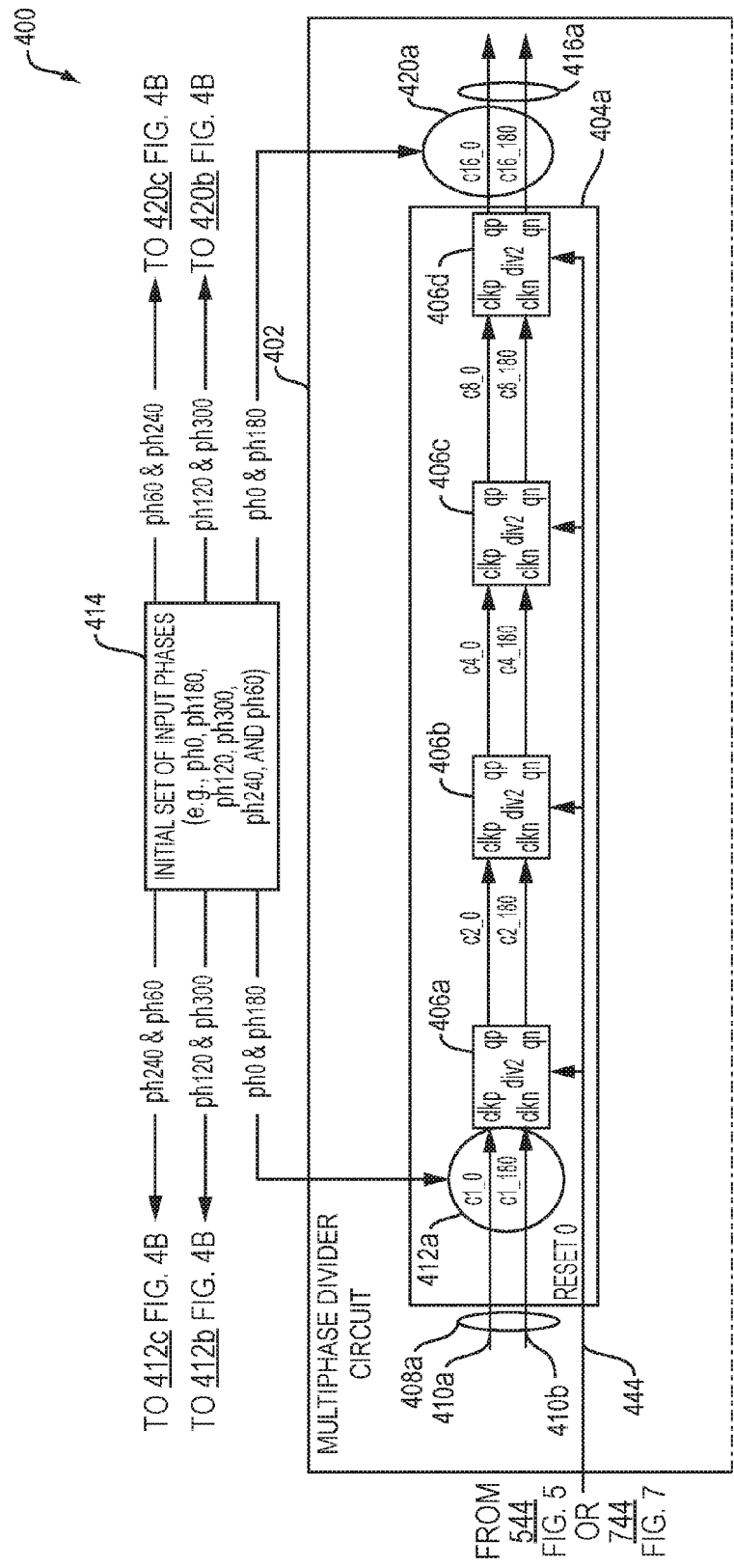
FIG. 4A is a block diagram of an example embodiment of a multiphase divider circuit.
Figure 4B:
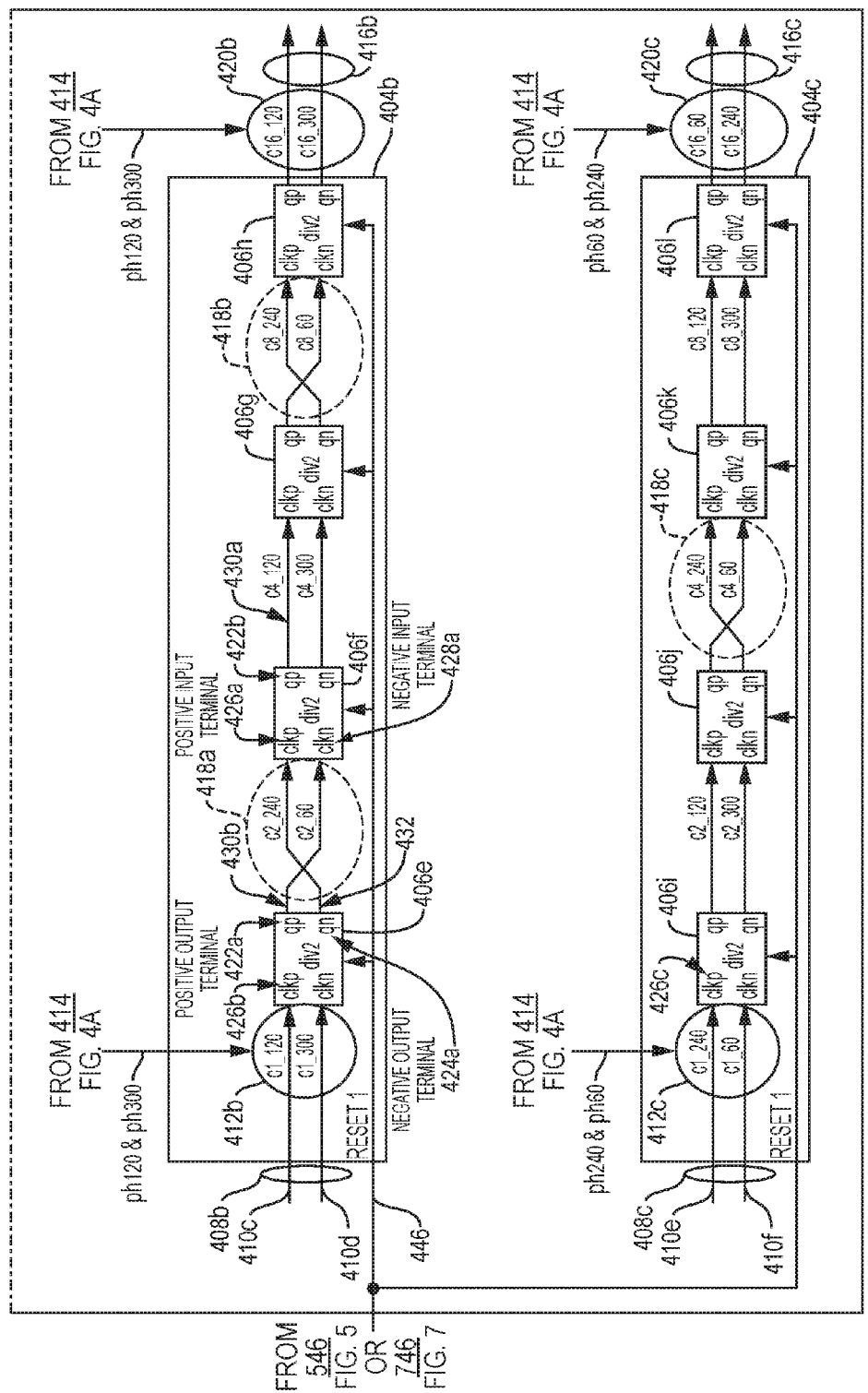
FIG. 4B is a continuation of the block diagram of the example embodiment of the multiphase divider circuit of FIG. 4A.

FIGS. 4A and 4B form a circuit diagram 400 of an example embodiment of a multiphase divider circuit 402 that is a phase preserving divider circuit. The multiphase divider circuit 402 comprises at least one frequency divider chain, that is, a first frequency divider chain 404a, a second frequency divider chain 404b, and a third frequency divider chain 404c in the example embodiment.

The first divider chain 404a, the second divider chain 404b, and the third divider chain 404c are each composed of a respective plurality of differential frequency dividers, that is, a first respective plurality of differential frequency dividers 406a-d, a second respective plurality of differential frequency dividers 406e-h, and a third respective plurality of differential frequency dividers 406i-1, respectively. According to an example embodiment, each differential frequency divider of each respective plurality of differential frequency dividers, that is, the first respective plurality of differential frequency dividers 406a-d, the second respective plurality of differential frequency dividers 406e-h, and the third respective plurality of differential frequency dividers 406i-1 in the example embodiment, may be a divide-by-two differential frequency divider.

The first divider chain 404a, the second divider chain 404b, and the third divider chain 404c are each configured to receive a respective input pair of input signals of a plurality of input signals 410a-f with respective input phases of an initial set of input phases 414 that includes phases of 0°, 180°, 120°, 300°, 240°, and 60° in the example embodiment. For example, the multiphase divider circuit 402 is configured to receive the plurality of input signals 410a-f.

The first divider chain 404a is configured to receive a first respective input pair of input signals 408a that includes the input signals 410a and 410b with the first respective input phases 412a of 0° (i.e., ph0) and 180° (i.e., ph180), respectively, of the initial set of input phases 414.

The second divider chain 404b is configured to receive a second respective input pair of input signals 408b that includes the input signals 410c and 410d with the second respective input phases 412b of 120° (i.e., ph120) and 300° (i.e., ph300), respectively, of the initial set of input phases 414.

The third divider chain 404c is configured to receive the third respective input pair of input signals 408c that includes the input signals 410e and 410f with the third respective input phases 412c of 240° (i.e., ph240) and 60° (i.e., ph60), respectively, of the initial set of input phases 414.

The first divider chain 404a, the second divider chain 404b, and the third divider chain 404c are each configured to produce a respective output pair of output signals, that is, a first respective output pair of output signals 416a, a second respective output pair of output signals 416b, and a third respective output pair of output signals 416c, respectively, by performing multiple frequency divisions of the first respective input pair of input signals 408a, the second respective input pair of input signals 408b, and the third respective input pair of input signals 408c, respectively, via the first respective plurality of differential frequency dividers 406a-d, the second respective plurality of differential frequency dividers 406e-h, and the third respective plurality of differential frequency dividers 406i-1, respectively.

The first respective output pair of output signals 416a are produced with the first respective output phases 420a of 0° (i.e., ph0) and 180° (i.e., ph180). The second respective output pair of output signals 416b are produced with the second respective output phases 420b of 120° (i.e., ph120) and 300° (i.e., ph300). The third respective output pair of output signals 416c are produced with the third respective output phases 420c of 60° (i.e., ph60) and 240° (i.e., ph240).

According to an example embodiment, each respective input pair of input signals may be a respective input pair of complementary input signals and each respective output pair of output signals may be a respective output pair of complementary output signals, wherein complementary signals have a phase difference of 180°. For example, in the example embodiment of FIGS. 4A and 4B, the first respective input pair of input signals 408a is composed of the input signals 410a and 410b with the first respective input phases 412a of 0° (i.e., ph0) and 180° (i.e., ph180), which are complementary signals as the first respective input phases have a phase difference of 180°. Likewise, the first respective output pair of output signals 416a have respective output phases of 0° (i.e., ph0) and 180° (i.e., ph180) and, thus, are also complementary signals.

The second respective input pair of input signals 408b is composed of the input signals 410c and 410d with the second respective input phases 412b of 120° (i.e., ph120) and 300° (i.e., ph300), which are complementary signals as the second respective input phases have a phase difference of 180°. Likewise, the second respective output pair of output signals 416b have respective output phases of 120° (i.e., ph120) and 300° (i.e., ph300) and, thus, are also complementary signals.

The third respective input pair of input signals 408c is composed of the input signals 410e and 410f with the third respective input phases 412c of 240° (i.e., ph240) and 60° (i.e., ph60), which are complementary signals as the third respective input phases have a phase difference of 180°.

Likewise, the third respective output pair of output signals 416c have respective output phases of 60° (i.e., ph60) and 240° (i.e., ph240) and, thus, are also complementary signals.

According to an example embodiment, one or more frequency divider chains of the at least one frequency divider chain may be configured to include at least one phase inversion, such as the phase inversion 118 of FIG. 1, disclosed above.

Turning back to the example embodiment of FIGS. 4A and 4B, the second divider chain 404b includes a first phase inversion 418a and a second phase inversion 418b and the third divider chain 404c includes a third phase inversion 418c. The first phase inversion 418a and the second phase inversion 418b are located along the second divider chain 404b to produce the second respective output pair of output signals 416b with respective output phases, that is, the second respective output phases 420b of 120° (i.e., ph120) and 300° (i.e., ph300) that are from within the initial set of input phases 414.

The third phase inversion 418c is located along the third divider chain 404c to produce the third respective output pair of output signals 416c with respective output phases, that is, the respective output phases 420c of 60° (i.e., ph60) and 240° (i.e., ph240) are from within the initial set of input phases 414.

According to an example embodiment, the at least one phase inversion may be implemented by cross-connecting a) differential output terminals of a given differential frequency divider of the respective plurality of differential frequency dividers, with b) differential input terminals of a successive differential frequency divider of the respective plurality of differential frequency dividers. The at least one phase inversion may prevent the successive differential frequency divider from producing a differential output signal from its positive output terminal with a divided output phase that is outside of the initial set of input phases.

For example, in the example embodiment of FIGS. 4A and 4B, the first phase inversion 418a is implemented by cross-connecting a) the differential output terminals, that is, the first positive output terminal 422a that is a first non-inverting differential output terminal, and the first negative output terminal 424a that is an inverting differential output terminal of the differential frequency divider 406e of the second respective plurality of differential frequency dividers 406e-h, with b) the differential input terminals, that is, the first positive input terminal 426a, that is a first non-inverting differential data input terminal, and the first negative input terminal 428a, that is a first inverting differential clock input terminal, of the successive differential frequency divider 406f of the second respective plurality of differential frequency dividers 406e-h. The first phase inversion 418a prevents the successive differential frequency divider 406f from producing the differential output signal 430a from its positive output terminal 422b with a divided output phase that is outside of the initial set of input phases 414.

For example, in the example embodiment of FIGS. 4A and 4B, each of the differential frequency dividers 406a-1 is a divide-by-two (i.e., div2) differential frequency divider. Since the input signal 410c to the positive input terminal 426b of the differential frequency divider 406e has a phase of 120°, the differential output signal 430b from its positive output terminal 422a has half the number of phases, and thus, has a phase of 60°. Absent the phase inversion 418a, the differential output signal 430b would be input to the first positive input terminal 426a of the successive differential frequency divider 406f. As such, the successive differential frequency divider 406f would produce the differential output signal 430a from its positive output terminal 422b with a divided output phase of 30° that is outside of the initial set of input phases 414. By implementing the phase inversion 418a, the differential output signal 430a has a divided output phase of 120° that is within the initial set of input phases 414.

Similarly, the phase inversion 418b prevents the successive differential frequency divider 406h from producing a differential output signal from its positive output terminal with a divided output phase that is outside of the initial set of input phases. For example, absent the phase inversion 418b, the successive differential frequency divider 406h would produce a differential output signal from its positive output terminal with a divided output phase of 30° that is outside of the initial set of input phases 414. By implementing the phase inversion 418b, the successive differential frequency divider 406h produces the differential output signal from its positive output terminal with a divided output phase of 120° that is within the initial set of input phases 414.

Likewise, the phase inversion 418c prevents the successive differential frequency divider 406k from producing a differential output signal from its positive output terminal with a divided output phase that is outside of the initial set of input phases. For example, absent the phase inversion 418c, the successive differential frequency divider 406k would produce a differential output signal from its positive output terminal with a divided output phase of 30° that is outside of the initial set of input phases 414. By implementing the phase inversion 418c, the successive differential frequency divider 406k produces the differential output signal from its positive output terminal with a divided output phase of 120° that is within the initial set of input phases 414.

As disclosed above, the multiphase divider circuit 402 receives the input signals 410a, 410b, 410c, 410d, 410e, and 410f, that is, the input signals c1_0, c1_180, c1_120, c1_300, c1_240, and c1_60 with respective phases of 0, 180°, 120°, 300°, 240°, 60°. The multiphase divider circuit 402 performs multiple divide by two divisions of such input signals and produces divided output signals (i.e., c16_0, c16_180, c16_120, c16_300, c16_60, and c16_240) that have been divided down by 16 and have respective phases of 0, 180°, 120°, 300°, 60°, and 240°. It should be understood that such divided output signals may be re-ordered to restore an original ordering of the phases. Since all phases input to the multiphase divider circuit 402 have been preserved at the divided outputs and produced in a deterministic manner, reordering to achieve an original order may be performed easily if needed.

According to an example embodiment, each differential frequency divider of each respective plurality of differential frequency dividers may be configured to (i) be clocked via a rising edge of a differential input signal to its positive input terminal, (ii) produce a first differential output signal from its positive output terminal with half a number of phases relative to the differential input signal, and (iii) produce a second differential output signal from its negative output terminal, wherein the second differential output signal is a complementary signal of the first differential output signal.

For example, in the example embodiment of FIGS. 4A and 4B, the differential frequency divider 406a is configured to (i) be clocked via a rising edge of a differential input signal to its positive input terminal, that is, the rising edge of the input signal 410c that is input to its positive input terminal 426b that is a non-inverting differential clock input terminal (ii) produce a first differential output signal from its positive output terminal, that is the differential output signal 430*b* out from its non-inverting differential data output terminal that has half a number of phases (i.e., 60°) relative to the differential input signal 410*c* with a phase of 120°, and (iii) produces a second differential output signal 432 from its negative output terminal 424*a* that is an inverting differential data output terminal, wherein the second differential output signal 432 is a complementary signal of the first differential output signal 430*b*.

Likewise, each of the differential frequency dividers 406*a*-1 may be clocked via the rising edge of the respective differential input signal to its positive input terminal, produce a respective differential output signal from its positive output terminal with half a number of phases relative to its respective differential input signal, and produce a respective differential output signal from its negative output terminal, wherein the respective differential output signal is a complementary signal of the respective differential output signal from its positive output terminal.

According to an example embodiment, each frequency divider chain of the at least one frequency divider chain may be resettable. For example, the frequency divider chain 104 of FIG. 1, and the first divider chain 404*a*, second divider chain 404*b*, and third divider chain 404*c* of FIGS. 4A and 4B, may be resettable. According to an example embodiment, a phase preserving multiphase divider circuit, such as the multiphase divider circuit of 102 of FIG. 1 and the multiphase divider circuit 402 of FIGS. 4A and 4B, may comprise a reset signal generator (not shown), such as the reset signal generators of FIG. 5 or FIG. 7, disclosed further below, configured to reset the frequency divider chain 104 of FIG. 1 and the first divider chain 404*a*, second divider chain 404*b*, and third divider chain 404*c* of FIGS. 4A and 4B.

Figure 5:
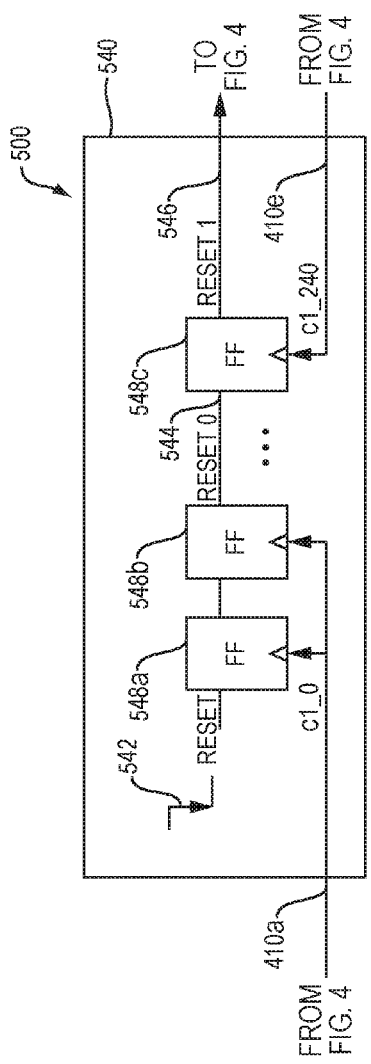
FIG. 5 is a circuit diagram of an example embodiment of a reset signal generator.

FIG. 5 is a circuit diagram 500 of an example embodiment of a reset signal generator 540. The reset signal generator 540 may be employed to reset the frequency divider chain 104 of FIG. 1 and the first divider chain 404*a*, second divider chain 404*b*, and third divider chain 404*c* of FIGS. 4A and 4B, disclosed above.

The reset signal generator 540 may be configured to receive an external reset signal 542. The reset signal generator 540 may be configured to produce a first synchronized reset signal 544, derived from the external reset signal 542. The frequency divider chain 104 of FIG. 1 may be configured to be reset by the first synchronized reset signal 544.

Turning back to FIGS. 4A and 4B, the first divider chain 404*a* may be configured to be reset by a first reset signal 444 and the second divider chain 404*b* and the third divider chain 404*c* may be configured to be reset by a second reset signal 446. The first reset signal 444 and the second reset signal 446 may be produced by a reset signal generator, such as the reset signal generator 540 of FIG. 5 and may correspond to the first synchronized reset signal 544 and a second synchronized reset signal 546, respectively, wherein the reset signal generator 540 may be configured to produce the second synchronized reset signal 546 that may be derived from the first synchronized reset signal 544.

According to an example embodiment, a starting (i.e., beginning) differential frequency divider of the first frequency divider chain, such as the differential frequency divider 406*a* that is the starting differential frequency divider of the first divider chain 404*a* in the example embodiment of FIGS. 4A and 4B, may be configured to receive a given input signal of the plurality of input signals 410*a-f* at its positive input terminal, such as the input signal 410*a* that may be received at its non-inverting (i.e., positive) differential clock input terminal. According to the example embodiment, the first synchronized reset signal 544 may be synchronized to the given input signal, that is, the input signal 410*a* that has zero phase.

Turning back to FIG. 5, the reset signal generator 540 may include dual back-to-back flip-flops (FFs). The dual back-to-back FFs may include a first flip-flop (FF) 548*a* and a second FF 548*b*. The first FF 548*a* may be configured to receive an external reset signal 542. The first FF 548*a* and the second FF 548*b* may be configured to be clocked by the given input signal, that is, the input signal 410*a* that has zero phase. The second FF 548*b* may be configured to produce the first synchronized reset signal 544 (i.e., reset0) that may be employed as the first reset signal 444 in the example embodiment of FIGS. 4A and 4B. The given input signal, that is, the input signal 410*a* that has zero phase, may be referred to interchangeably herein as a first given input signal.

The reset signal generator 540 may further include a third FF 548*c*. The third FF 548*c* may be configured to receive the first synchronized reset signal 544 and to be clocked by a second given input signal of the plurality of input signals 410*a-f*, that is, the input signal 410*e* with a phase of 240° in the example embodiment, to produce the second synchronized reset signal 546. The second given input signal may be a particular input signal that is received at a positive input terminal of a second starting differential frequency divider of the third divider chain, that is, the input signal 410*e* that is received at the positive input terminal 426*c* of the differential frequency divider 406*i*.

The differential frequency divider 406*i* is a starting differential frequency divider of the third divider chain 404*c* because it is the differential frequency divider that begins the third divider chain 404*c*. The positive input terminal 426*c* may be a non-inverting differential clock input terminal to the differential frequency divider 406*i*. Such first and second given input signals, that is, the input signal 410*a* that has zero phase and the input signal 410*e* that has 240° of phase, may be advantageously selected to clock the FFs of the reset signal generator 540 in order to obviate glitches or phase uncertainties at an output of the differential frequency dividers employed by the divider chains being reset. The input signal 410*a* that has zero phase and the input signal 410*e* that has 240° of phase may be advantageously selected to maximize a timing margin between rising edges of the first synchronized reset signal 544 and the second synchronized reset signal 546 to obviate such glitches or phase uncertainties, as disclosed below. By obviating glitches or phase uncertainties, higher frequency clocks may be divided down and, thus, a bandwidth of the multiphase divider circuit may be maximized.

The reset signal generator 540 may be configured to maximize the timing margin, that is, the timing margin between rising edges of the first synchronized reset signal 544 and the second synchronized reset signal 546, by synchronizing the external reset signal 542 with a first input signal of the plurality of input signals to produce the first synchronized reset signal 544 used to reset the first divider chain and synchronizing the first synchronized reset signal with a second input signal of the plurality of input signals to produce the second synchronized reset signal 546 used to reset the second divider chain and the third divider chain. Timing of such reset signals generated by the reset signal generator 540 is disclosed below, with reference to FIG. 6.

Figure 6:
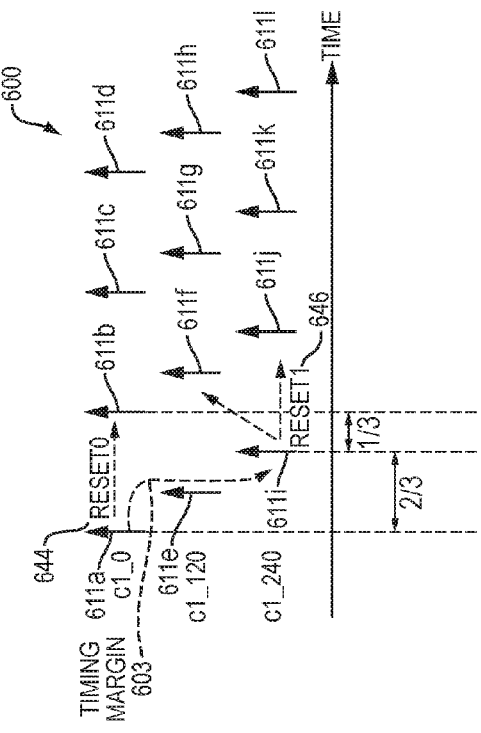
FIG. 6 is a timing diagram 600 of an example embodiment of a timing margin between rising edges of a first synchronized reset signal and a second synchronized reset signal generated by the reset signal generator of FIG. 5.

FIG. 6 is a timing diagram 600 of an example embodiment of a timing margin 603 between rising edges of the first synchronized reset signal 544 and the second synchronized reset signal 546 generated by the reset signal generator 540 of FIG. 5. In the timing diagram 600, the rising edges 611*a-d*, 611*e-h*, and 611*i*-1 correspond to the rising edges of the input signals 410*a* (i.e., input signal with zero phase), 410*c* (i.e., input signal with 120° phase), and 410*e* (i.e., input signal with 240° phase), respectively, that are input to respective positive input terminals of starting differential amplifiers of the first divider chain 404*a*, the second divider chain 404*b*, and the third divider chain 404*c*, respectively.

As disclosed above with reference to FIG. 5, a timing margin between rising edges of the first synchronized reset signal 544 and the second synchronized reset signal 546 may be maximized. Such a timing margin may be maximized by selecting an appropriate clock input for clocking the third FF 548*c*. For example, as shown in the timing diagram 600 of FIG. 6, the timing margin 603 may be two-thirds of a clock period of the first input signal, that is, the input signal 410*a* from FIGS. 4A and 4B. The input signal 410*e* may be selected to clock the third FF 548*c* because such a signal maximizes the timing margin 603 of FIG. 6. By employing the input signal 410*e* (i.e., c1_240), the timing margin 603 is ⅔ of the clock period of the input signal 410*a* (i.e., c1_0). Alternatively, had the input signal 410*c* (i.e., c1_120) been selected to clock the third FF 548*c*, the timing margin 603 would be only ⅓ of the clock period of the input signal 410*e*. By selecting the input signal 410*e* (i.e., c1_240) to clock the third FF 548*c*, the timing margin between a rising edge 644 of the first synchronized reset signal 544 and a rising edge 646 of the second reset signal 546 is advantageously ⅔ of the clock period of the first synchronized reset signal 544 as the clock period of the first synchronized reset signal 544 is that of the input signal 410*a* (i.e., c1_0).

Such reset signal generation as disclosed above has advantages. Reset signal generation and propagation takes a finite amount of time. Generation of a reset signal by a clock edge needs to settle down before a next phase of the clock arrives. By maximizing the timing margin (time between the two rising clock edges), an input clock period can be minimized without creating glitches or phase uncertainties at an output of a divider. As such, an example embodiment of reset generation, disclosed above, enables higher frequency clocks to be divided down and, thus, maximizes a bandwidth of the divider.

It should be understood that embodiments disclosed herein may be applied to more or less divider chains, more or less dividers in the divider chains, and more or less phases of a multiphase signal than employed by the phase preserving multiphase divider circuits of FIG. 1 and FIGS. 4A and 4B, disclosed above, or the phase preserving multiphase divider circuits of FIGS. 9A and 9B, disclosed further below. Further, it should be understood that a multiphase signal and individual input signals composing same that may be input the phase preserving multiphase divider circuits disclosed herein is not restricted to any particular type of waveform, for example the waveform may be a square wave, such as disclosed above with reference to FIG. 2B, or a trapezoidal waveform, or any other suitable waveform.

An example embodiment of a phase preserving multiphase divider circuit, such as the phase preserving multiphase divider circuits of FIG. 1 and FIGS. 4A and 4B, disclosed above, may employ divider chain(s) in which each divider is a divide by two differential divider cell that is clocked by a rising edge of its p input clock, that is, a rising edge of an input signal to its non-inverting differential clock input terminal. In order to maintain proper phase relations, an example embodiment employs phase inversion along a divider chain, as disclosed above with reference to FIG. 1 and FIGS. 4A and 4B.

An example embodiment may employ reset signals that may be synchronized to each p input clock input to starting differential dividers of each of the divider chains of the multiphase divider circuit. For example, the example embodiment of the multiphase divider circuit of FIGS. 4A and 4B employs three divider chains. As disclosed above with reference to FIG. 5 and FIG. 6, the reset signals (i.e., reset0 and reset1) may be synchronized with all three p input clocks to the starting differential dividers of the three divider chains.

For example, reset0 is synchronized to the input signal 410 (i.e., c1_0) using the two back to back FFs 548*a* and 548*b* to reset the first divider chain 404*a* of FIGS. 4A and 4B. This reset0 is then re-synchronized with the input signal 410*e* (i.e., c1_240) to reset the other divider chains, that is the second divider chain 404*b* and the third divider chain 404*c*. Such an embodiment maximizes the timing margin for the reset signal reset1 (i.e., ⅔ of the input clock c1_0's period). An example embodiment of another reset generator configured to maximize such a timing margin is disclosed below, with reference to FIG. 7.

Figure 7:
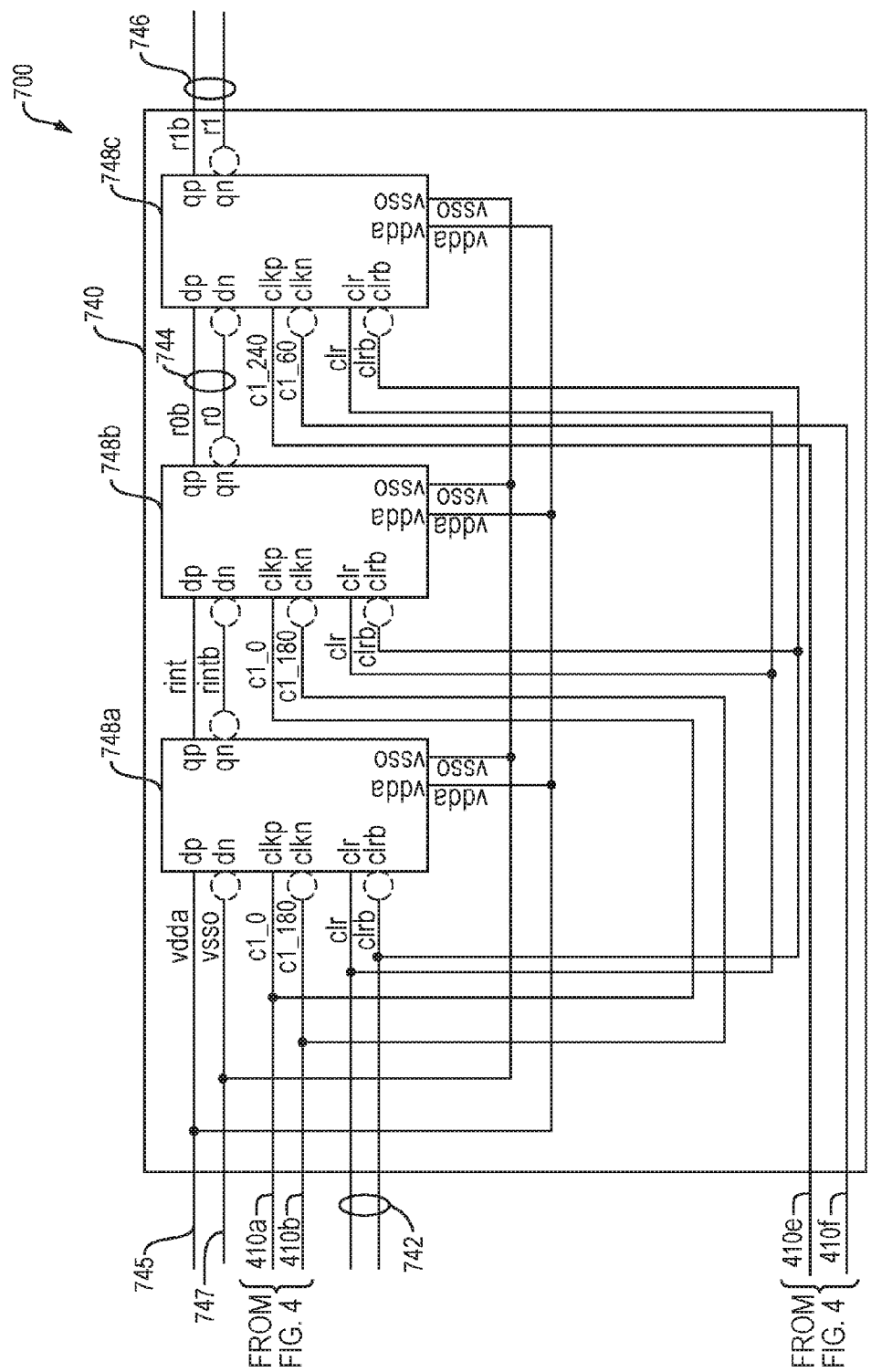
FIG. 7 is a circuit diagram of another example embodiment of a reset signal generator.

FIG. 7 is a circuit diagram 700 of another example embodiment of a reset signal generator 740. The reset signal generator 740 may be employed to reset the frequency divider chain 104 of FIG. 1 and the first divider chain 404*a*, second divider chain 404*b*, and third divider chain 404*c* of FIGS. 4A and 4B, disclosed above.

The reset generator 740 is composed of a first FF 748*a*, a second FF 748*b*, and a third FF 748*c*. The first FF 748*a*, the second FF 748*b*, and the third FF 748*c* are connected in series and each is a differential D flip-flop with an asynchronous reset composed of a non-inverted asynchronous differential reset input (i.e., clr) 742 and an inverted asynchronous differential reset input (i.e., clrb) 743. The first FF 748*a*, the second FF 748*b*, and the third FF 748*c* are each coupled to a positive supply voltage 745 and a negative supply voltage 747.

An external reset signal 742 may be composed of the non-inverted and inverted asynchronous differential reset inputs (i.e., clr and clrb). The reset signal generator 740 may be configured to produce a first synchronized reset signal 744 (i.e., reset0), that may be derived from the external reset signal 742 and composed of the non-inverted and inverted differential data outputs of the second FF 748*b*. The frequency divider chain 104 of FIG. 1 may be configured to be reset by the first synchronized reset signal 744.

Turning back to FIGS. 4A and 4B, the first divider chain 404*a* may be configured to be reset by a first reset signal 444 and the second divider chain 404*b* and the third divider chain 404*c* may be configured to be reset by a second reset signal 446. The first reset signal 444 and the second reset signal 446 may be produced by a reset signal generator, such as the reset signal generator 740 of FIG. 7, and may correspond to the first synchronized reset signal 744 and a second synchronized reset signal 746 of FIG. 7, respectively. The reset signal generator 740 may be configured to produce the second synchronized reset signal 746 that may be derived from the first synchronized reset signal 744. The second synchronized reset signal 746 may be composed of the non-inverted and inverted differential outputs from the third FF 748*c*.

According to an example embodiment, a starting differential frequency divider of the first frequency divider chain, such as the differential frequency divider 406*a* of the first divider chain 404*a* in the example embodiment of FIGS. 4A and 4B, may be configured to receive a given input signal of the plurality of input signals 410*a-f* at its positive input terminal, such as the input signal 410a (i.e., c1_0), and the first synchronized reset signal 744 may be synchronized to the given input signal 410a.

For example, turning back to FIG. 7, the given input signal, that is, the input signal 410a (i.e., c1_0), may be received at a non-inverted differential clock input of the first FF 748b that has it non-inverted differential data input coupled to the positive supply voltage 745 and its inverted differential data input coupled to the negative supply voltage 747. The non-inverted and inverted differential outputs (i.e., rintb and rint, respectively) of the first FF 748a may be coupled to the non-inverted and inverted differential data inputs (i.e., dp and dn, respectively) of the second FF 748b, respectively. The non-inverted and inverted differential data outputs (i.e., r0b and r0, respectively) of the second FF 748b may be coupled to the non-inverted and inverted differential data inputs (i.e., dp and dn, respectively) of the third FF 748b, respectively.

The first FF 748a and the second FF 748b may be configured to be clocked by the given input signal, that is, the input signal 410a (i.e., c1_0). The given input signal may be referred to as a first given input signal. The second FF 748b may be configured to produce the first synchronized reset signal 744 that may be employed as the first reset signal 444 in the example embodiment of FIGS. 4A and 4B. The third FF 748c may be configured to receive the first synchronized reset signal 744 and to be clocked by a second given input signal of the plurality of input signals 410a-f, that is, the input signal 410e (i.e., c1_240), to produce the second synchronized reset signal 746.

The second given input signal, that is the input signal 410e, may be a particular input signal that is received by a second starting differential frequency divider of the third divider chain, that is, the input signal 410e that is received at the positive input terminal 426c of the differential frequency divider 406i that starts the third divider chain 404c. The input signal 410e may be input to the non-inverted differential clock input of the third FF 748c and its complementary signal, that is, the input signal 410f may be input to the inverted differential clock input of the third FF 748c.

The reset signal generator 740 may be further configured to maximize a timing margin between rising edges of the first synchronized reset signal 544 and the second synchronized reset signal 746. The reset signal generator 740 may be configured to maximize the timing margin by synchronizing the external reset signal 742 with a first input signal of the plurality of input signals to produce the first synchronized reset signal 744 used to reset the first divider chain and synchronizing the first synchronized reset signal with a second input signal of the plurality of input signals to produce the second synchronized reset signal 746 used to reset the second divider chain and the third divider chain. Timing of such reset signals generated by the reset signal generator 740 is disclosed above, with reference to FIG. 6.

Figure 8:
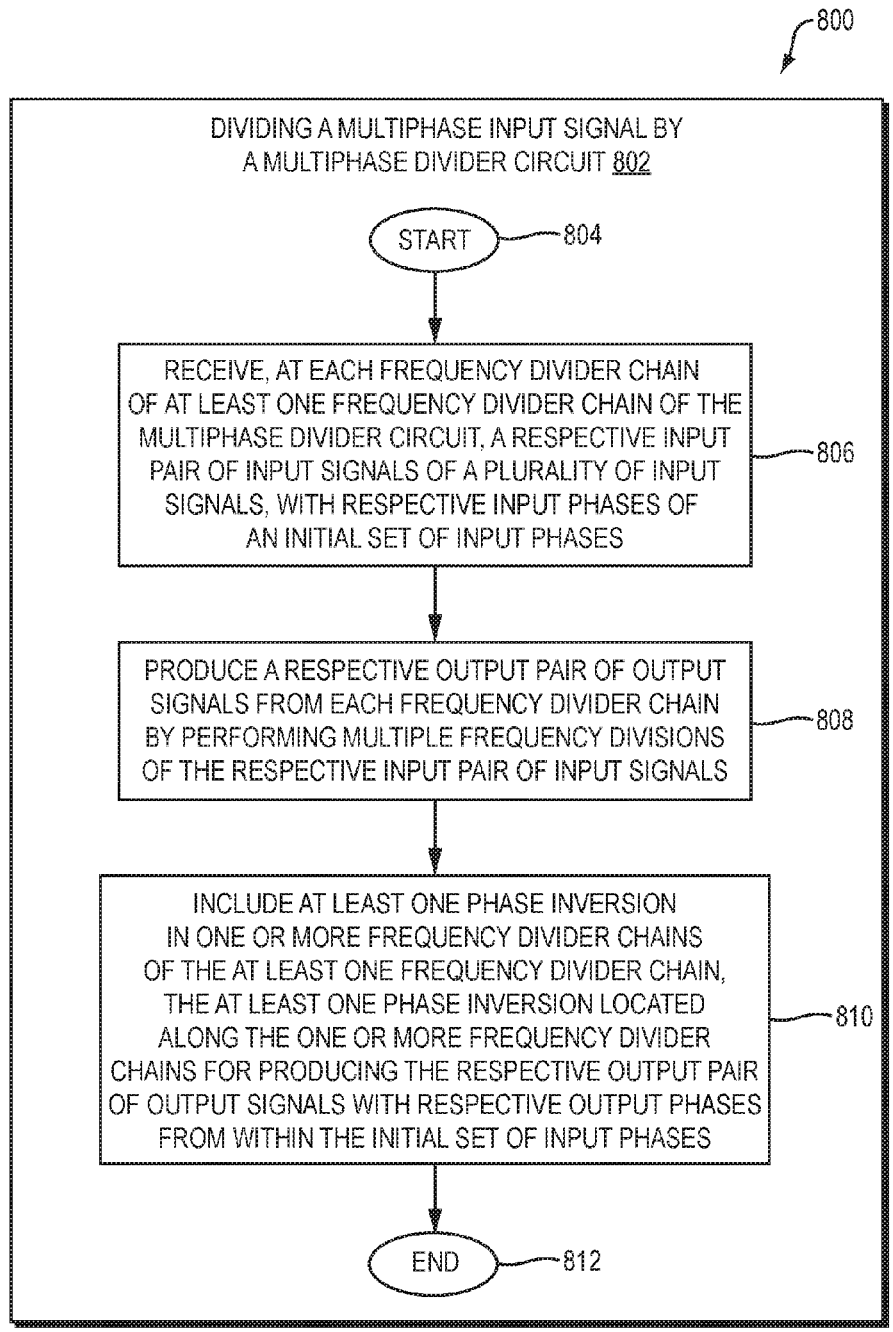
FIG. 8 is a flow diagram of an example embodiment of a method for dividing a multiphase input signal by a multiphase divider circuit.

FIG. 8 is a flow diagram 800 of an example embodiment of a method for dividing a multiphase input signal by a multiphase divider circuit (802). The method begins (804) and receives, at each frequency divider chain of at least one frequency divider chain of the multiphase divider circuit, a respective input pair of input signals of a plurality of input signals with respective input phases of an initial set of input phases (806). The plurality of input signals may compose the multiphase input signal. Each frequency divider chain of the at least one frequency divider chain may be composed of a respective plurality of differential frequency dividers. The method produces a respective output pair of output signals from each frequency divider chain by performing multiple frequency divisions of the respective input pair of input signals via the respective plurality of differential frequency dividers (808). The method includes at least one phase inversion in one or more frequency divider chains of the at least one frequency divider chain, the at least one phase inversion may be located along the one or more frequency divider chains for producing the respective output pair of output signals with respective output phases from within the initial set of input phases (810), and the method thereafter ends (812) in the example embodiment.

Figure 9A:
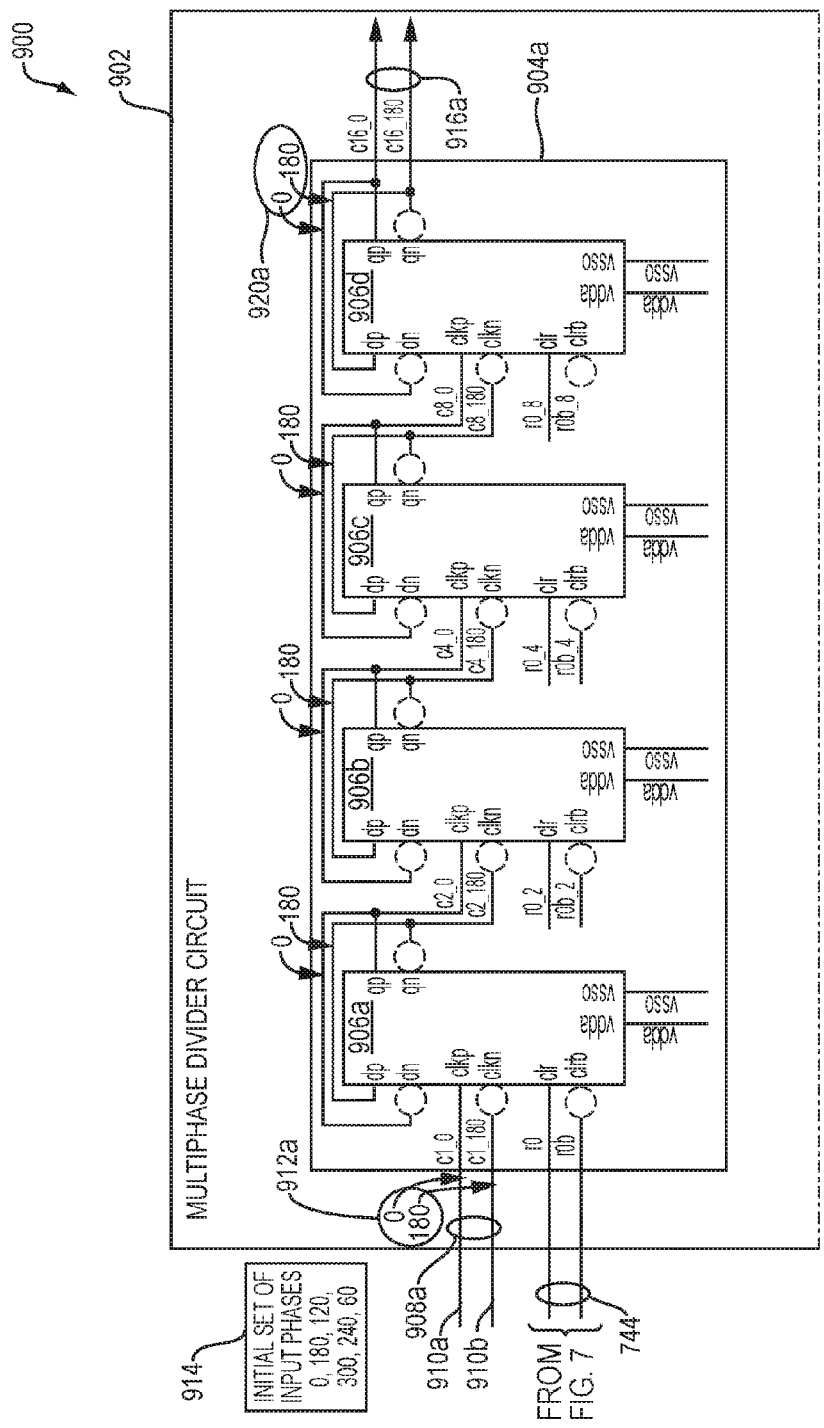
FIG. 9A is a circuit diagram of an example embodiment of a multiphase divider circuit.
Figure 9B:
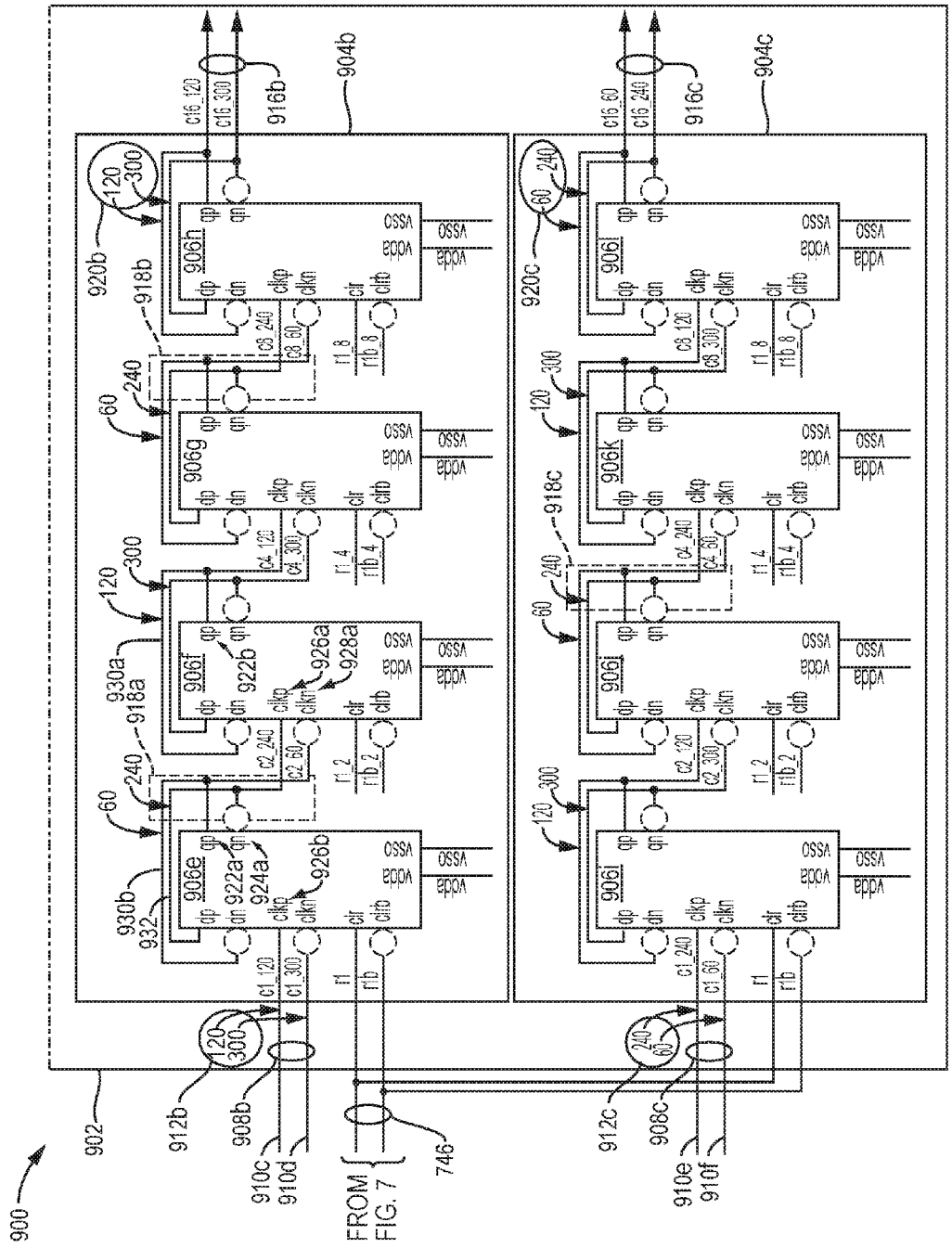
FIG. 9B is a continuation of the circuit diagram of the example embodiment of the multiphase divider circuit of FIG. 9A.

FIGS. 9A and 9B form a circuit diagram 900 of an example embodiment of another multiphase divider circuit 902 that is a phase preserving divider circuit. The multiphase divider circuit 902 comprises at least one frequency divider chain, that is, a first frequency divider chain 904a, a second frequency divider chain 904b, and a third frequency divider chain 904c in the example embodiment.

The first divider chain 904a, the second divider chain 904b, and the third divider chain 904c are each composed of a respective plurality of differential frequency dividers, that is, a first respective plurality of differential frequency dividers 906a-d, a second respective plurality of differential frequency dividers 906e-h, and a third respective plurality of differential frequency dividers 906i-1, respectively. According to an example embodiment, each differential frequency divider of each respective plurality of differential frequency dividers, that is, the first respective plurality of differential frequency dividers 906a-d, the second respective plurality of differential frequency dividers 906e-h, and the third respective plurality of differential frequency dividers 906i-1 in the example embodiment, may be a divide-by-two differential frequency divider.

The first divider chain 904a, the second divider chain 904b, and the third divider chain 904c are each configured to receive a respective input pair of input signals of a plurality of input signals 910a-f with respective input phases of an initial set of input phases 914 that includes phases of 0°, 180°, 120°, 300°, 240°, and 60° in the example embodiment. For example, the multiphase divider circuit 902 is configured to receive the plurality of input signals 910a-f. The first divider chain 904a is configured to receive a first respective input pair of input signals 908a that includes the input signals 910a and 910b with the first respective input phases 912a of 0° (i.e., ph0) and 180° (i.e., ph180), respectively, of the initial set of input phases 914.

The second divider chain 904b is configured to receive a second respective input pair of input signals 908b that includes the input signals 910c and 910d with the second respective input phases 912b of 120° (i.e., ph120) and 300° (i.e., ph300), respectively, of the initial set of input phases 914.

The third divider chain 904c is configured to receive the third respective input pair of input signals 908c that includes the input signals 910e and 910f with the third respective input phases 912c of 240° (i.e., ph240) and 60° (i.e., ph60), respectively, of the initial set of input phases 914.

The first divider chain 904a, the second divider chain 904b, and the third divider chain 904c are each configured to produce a respective output pair of output signals, that is, a first respective output pair of output signals 916a, a second respective output pair of output signals 916b, and a third respective output pair of output signals 916c, respectively, by performing multiple frequency divisions of the first respective input pair of input signals 908a, the second respective input pair of input signals 908b, and the third respective input pair of input signals 908c, respectively, via the first respective plurality of differential frequency dividers 906*a-d*, the second respective plurality of differential frequency dividers 906*e-h*, and the third respective plurality of differential frequency dividers 906*i-1*, respectively.

The first respective output pair of output signals 916*a* are produced with the first respective output phases 920*a* of 0° (i.e., ph0) and 180° (i.e., ph180). The second respective output pair of output signals 916*b* are produced with the second respective output phases 920*b* of 120° (i.e., ph120) and 300° (i.e., ph300). The third respective output pair of output signals 916*c* are produced with the third respective output phases 920*c* of 60° (i.e., ph60) and 240° (i.e., ph240).

According to an example embodiment, each respective input pair of input signals may be a respective input pair of complementary input signals and each respective output pair of output signals may be a respective output pair of complementary output signals, wherein complementary signals have a phase difference of 180°. For example, in the example embodiment of FIGS. 9A and 9B, the first respective input pair of input signals 908*a* is composed of the input signals 910*a* and 910*b* with the first respective input phases 912*a* of 0° (i.e., ph0) and 180° (i.e., ph180), which are complementary signals as the first respective input phases have a phase difference of 180°. Likewise, the first respective output pair of output signals 916*a* have respective output phases of 0° (i.e., ph0) and 180° (i.e., ph180) and, thus, are also complementary signals.

The second respective input pair of input signals 908*b* is composed of the input signals 910*c* and 910*d* with the second respective input phases 912*b* of 120° (i.e., ph120) and 300° (i.e., ph300), which are complementary signals as the second respective input phases have a phase difference of 180°. Likewise, the second respective output pair of output signals 916*b* have respective output phases of 120° (i.e., ph120) and 300° (i.e., ph300) and, thus, are also complementary signals.

The third respective input pair of input signals 908*c* is composed of the input signals 910*e* and 910*f* with the third respective input phases 912*c* of 240° (i.e., ph240) and 60° (i.e., ph60), which are complementary signals as the third respective input phases have a phase difference of 180°. Likewise, the third respective output pair of output signals 916*c* have respective output phases of 60° (i.e., ph60) and 240° (i.e., ph240) and, thus, are also complementary signals.

The second divider chain 904*b* includes a first phase inversion 918*a* and a second phase inversion 918*b* and the third divider chain 904*c* includes a third phase inversion 918*c*. The first phase inversion 918*a* and the second phase inversion 918*b* are located along the second divider chain 904*b* to produce the second respective output pair of output signals 916*b* with respective output phases, that is, the second respective output phases 920*b* of 120° (i.e., ph120) and 300° (i.e., ph300) that are from within the initial set of input phases 914.

The third phase inversion 918*c* is located along the third divider chain 904*c* to produce the third respective output pair of output signals 916*c* with respective output phases, that is, the respective output phases 420*c* of 60° (i.e., ph60) and 240° (i.e., ph240) are from within the initial set of input phases 914.

In the multiphase divider circuit 902, each differential frequency divider of the plurality of differential frequency dividers 906*a-1* is configured with its non-inverted differential output qp coupled to its inverted differential data input do and its inverted differential output qn coupled to its non-inverted differential data input dp. Absent phase inversion therebetween, consecutive differential frequency dividers of respective chains are each coupled by coupling the non-inverted differential output qp of a given differential frequency divider to the non-inverted differential clock input clkp of a successive differential divider and coupling the inverted differential output qn of the given differential frequency divider to the inverted differential clock input clkn of the successive differential divider.

In the event of phase inversion, consecutive differential frequency dividers of respective chains are each coupled by coupling the non-inverted differential output qp of the given differential frequency divider to the inverted differential clock input clkn of the successive differential divider and coupling the inverted differential output qn of the given differential frequency divider to the non-inverted differential clock input clkp of the successive differential divider.

As such, the first phase inversion 918*a* is implemented by cross-connecting a) the differential output terminals, that is, the first positive output terminal 922*a* that is a first non-inverting differential output terminal, and the first negative output terminal 924*a* that is an inverting differential output terminal of the differential frequency divider 906*e* of the second respective plurality of differential frequency dividers 906*e-h*, with b) the differential input terminals, that is, the first positive input terminal 926*a*, that is a first non-inverting differential data input terminal, and the first negative input terminal 928*a*, that is a first inverting differential clock input terminal, of the successive differential frequency divider 906*f* of the second respective plurality of differential frequency dividers 906*e-h*. The first phase inversion 918*a* prevents the successive differential frequency divider 906*f* from producing the differential output signal 930*a* from its positive output terminal 922*b* with a divided output phase that is outside of the initial set of input phases 914.

For example, in the example embodiment of FIGS. 9A and 9B, each of the differential frequency dividers 906*a-1* is a divide-by-two (i.e., div2) differential frequency divider. Since the input signal 910*c* to the positive input terminal 926*b* of the differential frequency divider 406*e* has a phase of 120°, the differential output signal 930*b* from its positive output terminal 922*a* has half the number of phases, and thus, has a phase of 60°. Absent the phase inversion 918*a*, the differential output signal 930*b* would be input to the first positive input terminal 926*a* of the successive differential frequency divider 906*f*. As such, the successive differential frequency divider 906*f* would produce the differential output signal 930*a* from its positive output terminal 922*b* with a divided output phase of 30° that is outside of the initial set of input phases 914. By implementing the phase inversion 918*a*, the differential output signal 930*a* has a divided output phase of 120° that is within the initial set of input phases 914.

Similarly, the phase inversion 918*b* prevents the successive differential frequency divider 906*h* from producing a differential output signal from its positive output terminal with a divided output phase that is outside of the initial set of input phases. For example, absent the phase inversion 918*b*, the successive differential frequency divider 906*h* would produce a differential output signal from its positive output terminal with a divided output phase of 30° that is outside of the initial set of input phases 914. By implementing the phase inversion 918*b*, the successive differential frequency divider 906*h* produces the differential output signal from its positive output terminal with a divided output phase of 120° that is within the initial set of input phases 914.

Likewise, the phase inversion 918*c* prevents the successive differential frequency divider 906*k* from producing a differential output signal from its positive output terminal with a divided output phase that is outside of the initial set of input phases. For example, absent the phase inversion 918c, the successive differential frequency divider 906k would produce a differential output signal from its positive output terminal with a divided output phase of 30° that is outside of the initial set of input phases 914. By implementing the phase inversion 918c, the successive differential frequency divider 906k produces the differential output signal from its positive output terminal with a divided output phase of 120° that is within the initial set of input phases 914.

In the example embodiment of FIGS. 9A and 9B, the differential frequency divider 906a is configured to (i) be clocked via a rising edge of a differential input signal to its positive input terminal, that is, the rising edge of the input signal 910c that is input to its positive input terminal 926b that is a non-inverting differential clock input terminal (ii) produce a first differential output signal from its positive output terminal, that is the differential output signal 930b out from its non-inverting differential data output terminal that has half a number of phases (i.e., 60°) relative to the differential input signal 910c with a phase of 120°, and (iii) produces a second differential output signal 932 from its negative output terminal 924a that is an inverting differential data output terminal, wherein the second differential output signal 932 is a complementary signal of the first differential output signal 930b.

Likewise, each of the differential frequency dividers 906a-1 may be clocked via the rising edge of the respective differential input signal to its positive input terminal, produce a respective differential output signal from its positive output terminal with half a number of phases relative to its respective differential input signal, and produce a respective differential output signal from its negative output terminal, wherein the respective differential output signal is a complementary signal of the respective differential output signal from its positive output terminal.

According to an example embodiment, each frequency divider chain of the multiphase divider circuit 902 may be resettable. As such, the first divider chain 904a, second divider chain 904b, and third divider chain 904c may be resettable. According to an example embodiment, the multiphase divider circuit of 902 may comprise a reset signal generator, such as the reset signal generator 702, disclosed above, that may be configured to reset the first divider chain 904a, second divider chain 904b, and third divider chain 904c.

For example, the first frequency divider chain 904a may be reset via the first synchronized reset signal 744 (i.e., reset0) produced by the reset generator 702. The first synchronized reset signal 744 may comprise a first pair of differential reset signals including a first non-inverted differential reset signal (i.e., r0b) and a first inverted differential reset signal (i.e., r0).

The first non-inverted differential reset signal (i.e., r0b) and the first inverted differential reset signal (i.e., r0) of the first synchronized reset signal 744 (i.e., reset0) may be input to a first inverted differential reset input (i.e., clrb) and a first non-inverted differential reset input (i.e., clr) of a first starting differential divider, that is, the differential divider 906a of the first divider chain 904a. Such a cross-connection may be employed because during the reset, a non-inverted differential output qp of the second FF 748b may be reset to '0', which, however, may need to be '1' to reset the differential frequency dividers 906a-d.

Subsequent differential frequency dividers of the first divider chain, such as the differential frequency dividers 906b-d may be reset in a similar manner via the first synchronized reset signal 744 (i.e., reset0). According to an example embodiment, the differential frequency dividers 906b-d may be reset via a buffered or gated version of the first synchronized reset signal 744 (i.e., reset0). For example, a gated version may be produced via additional control logic (not shown) to save power. As such, each of the differential frequency dividers 906b-d may be reset via the first synchronized reset signal 744 (i.e., reset0) or a buffered or gated version that is derived therefrom.

The second frequency divider chain 904b and the third frequency divider chain 904c may be reset via the second synchronized reset signal 746 (i.e., reset1) produced by the reset generator 702. The second synchronized reset signal 746 may comprise a second pair of differential reset signals including a second non-inverted differential reset signal (i.e., r1b) and a second inverted differential reset signal (i.e., r1).

The second non-inverted differential reset signal (i.e., r1b) and the second inverted differential reset signal (i.e., r1) of the second synchronized reset signal 746 (i.e., reset1) may be input to the inverted differential reset inputs (i.e., clrb) and non-inverted differential reset inputs (i.e., clr) of the starting differential dividers, that is, the differential frequency divider 906e and the differential frequency divider 906i of the second divider chain 904b and the third divider chain 904c, respectively. Such a cross-connection may be employed because during the reset, the non-inverted differential output qp of the third FF 748c may be reset to '0', which, however, may need to be '1' to reset the differential frequency dividers 906e-h of the second divider chain 904b and the differential frequency dividers 906i-1 of the third divider chain 904c. Each of the differential frequency dividers of the second divider chain 904b and the third divider chain 904c may be reset via the second synchronized reset signal 746 (i.e., reset1) or a buffered or gated version that is derived therefrom.

Figure 10A:
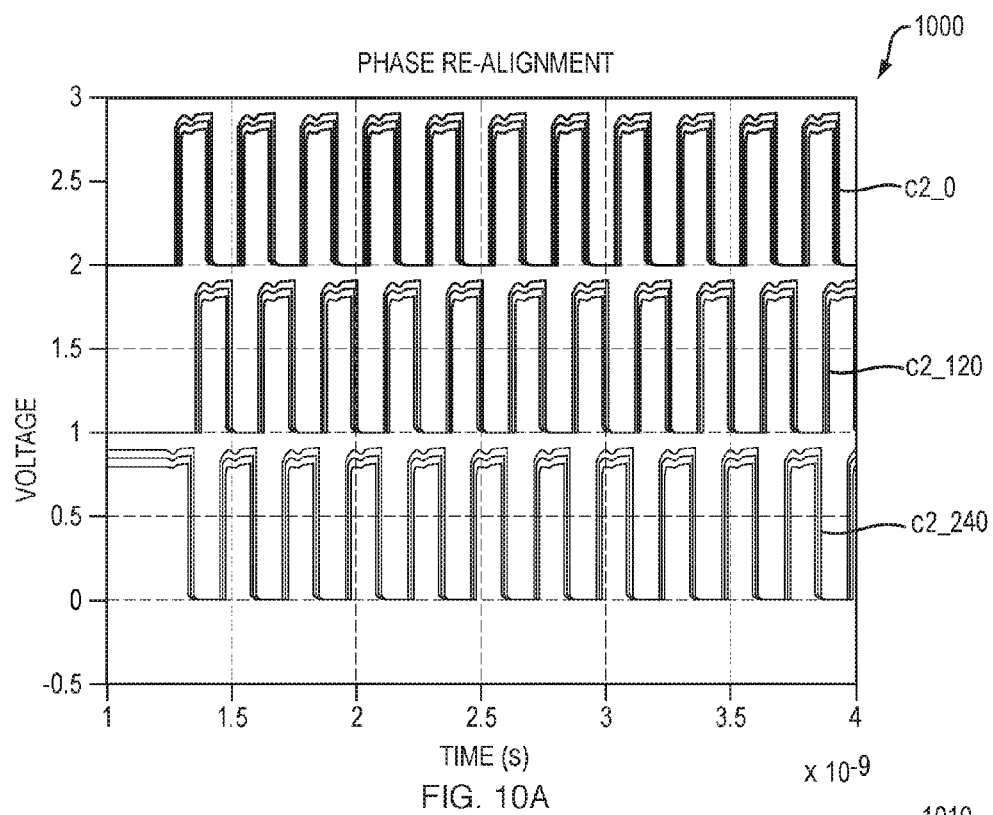
FIG. 10A is a plot of an example embodiment of timing signals of the multiphase divider circuit of FIGS. 9A and 9B following division by two.

As disclosed above, each of the differential frequency dividers 906a-1 may be divide by two dividers. Signal labels applied to signals of circuit diagrams disclosed herein may be referenced by "c" followed by a numeral, such as 1, 2, 4, 8, and 16, wherein such numeral reflects an amount of division performed along a divider chain. Such signal labels may further include an underscore, that is, "_," followed by another numeral indicating a phase of the signal. For example, the input signals 910a, 910b, 910c, 910e, and 910f have signal labels of c1_0, c1_180, c1_120, c1_300, c1_240, respectively, as such signals have not been divided down by the divider chain, hence, an amount of division is "1," and such input signals have respective phases of 0°, 180°, 120°, 300°, and 240°. FIGS. 10A-D, disclosed below, are plots of various signals of the multiphase divider circuit 902 produced by a Monte-Carlo simulation of the multiphase divider circuit 902, FIG. 10A is a plot 1000 of an example embodiment of timing signals of the multiphase divider circuit 902 of FIGS. 9A and 9B following division by two. The plot 1000 shows phase re-alignment of the signals c2_0, c2_120, and c2_240 produced by the multiphase divider circuit 902.

Figure 10B:
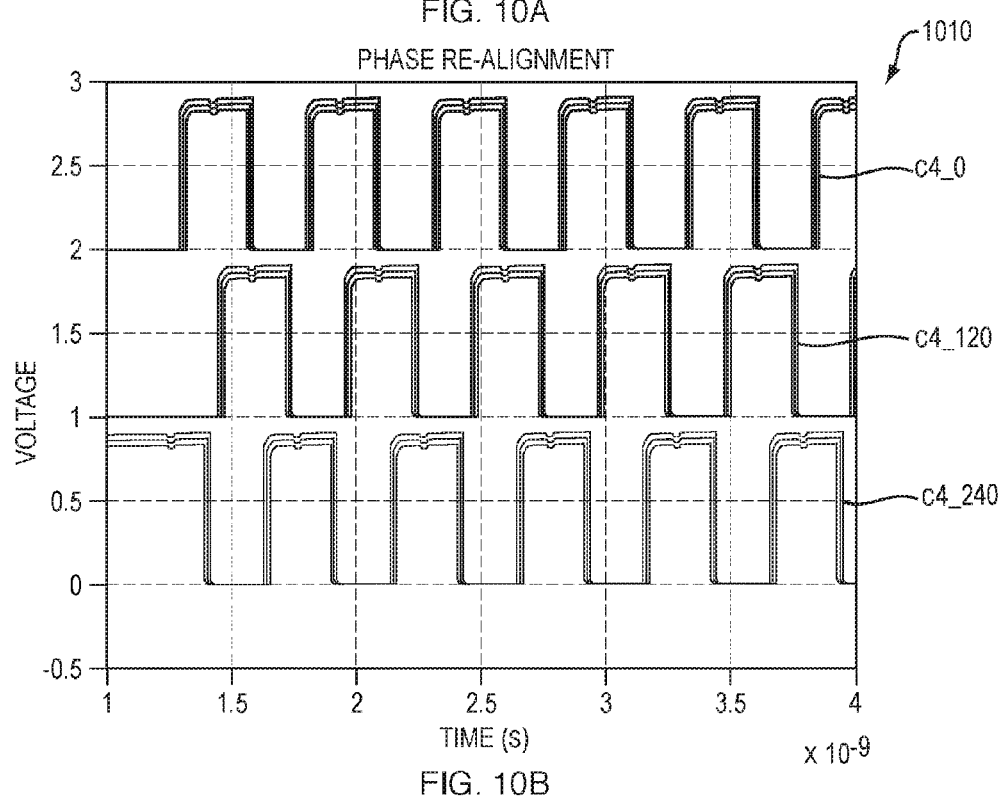
FIG. 10B is a plot of an example embodiment of timing signals of the multiphase divider circuit of FIGS. 9A and 9B following division by four.

FIG. 10B is a plot 1010 of an example embodiment of timing signals of the multiphase divider circuit 902 of FIGS. 9A and 9B following division by four. The plot 1000 shows phase re-alignment of the signals c4_0, c4_120, and c4_240 produced by the multiphase divider circuit 902.

Figure 10C:
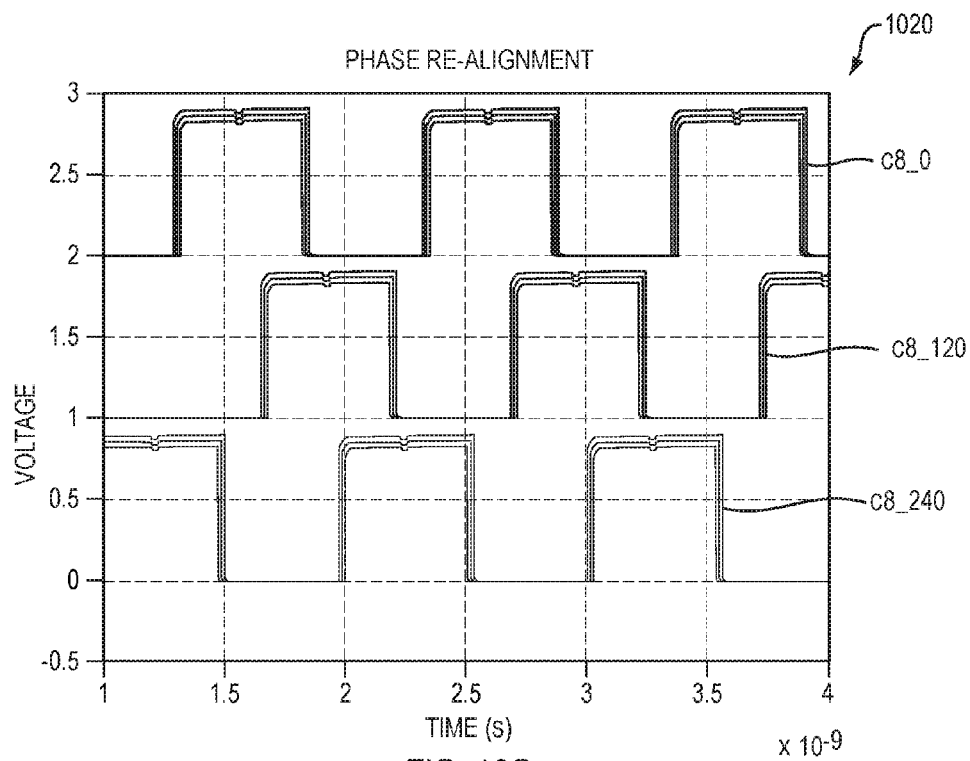
FIG. 10C is plot of an example embodiment of timing signals of the multiphase divider circuit of FIGS. 9A and 9B following division by eight.

FIG. 10C is a plot 1020 of an example embodiment of timing signals of the multiphase divider circuit 902 of FIGS. 9A and 9B following division by eight. The plot 1000 shows phase re-alignment of the signals c8_0, c8_120, and c8_240 produced by the multiphase divider circuit 902.

Figure 10D:
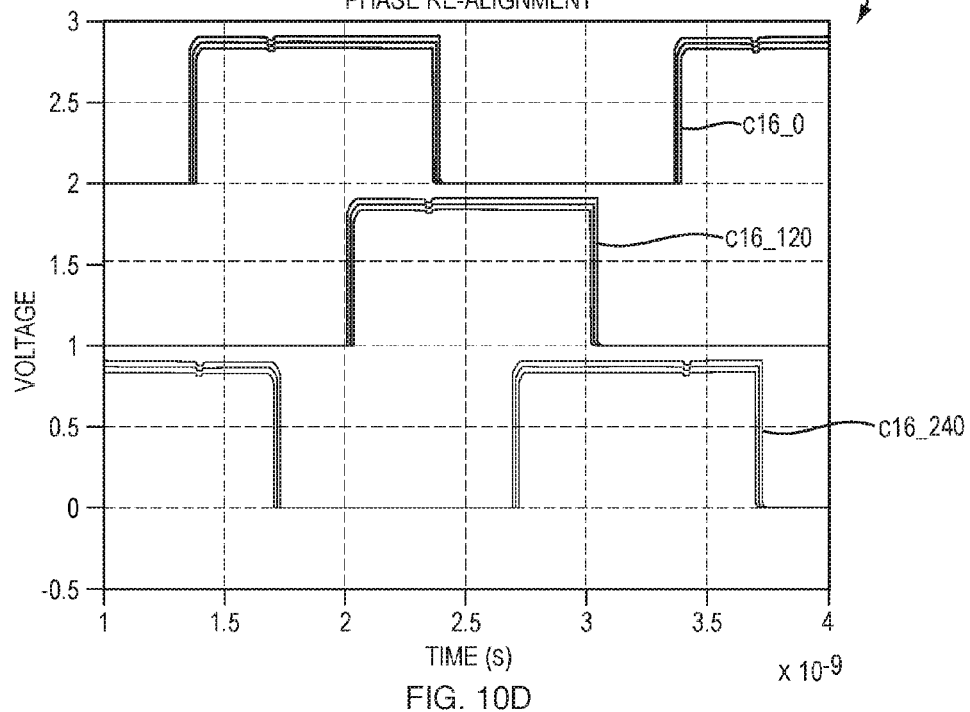
FIG. 10D is a plot of an example embodiment of timing signals of the multiphase divider circuit of FIGS. 9A and 9B following division by sixteen.

FIG. 10D is a plot 1030 of an example embodiment of timing signals of the multiphase divider circuit 902 of FIGS. 9A and 9B following division by sixteen. The plot 1000 shows phase re-alignment of the signals c16_0, c16_120, and c16_240 produced by the multiphase divider circuit 902.

Further example embodiments disclosed herein may be configured using a computer program product; for example, controls may be programmed in software for implementing example embodiments. Further example embodiments may include a non-transitory computer-readable medium containing instructions that may be executed by a processor, and, when loaded and executed, cause the processor to complete methods described herein. It should be understood that elements of the block and flow diagrams may be implemented in software or hardware, firmware, a combination thereof, or other similar implementation determined in the future. In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random access memory (RAM), read only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A multiphase divider circuit, the multiphase divider circuit comprising:
at least one frequency divider chain, each frequency divider chain of the at least one frequency divider chain composed of a respective plurality of differential frequency dividers and configured to receive a respective input pair of input signals of a plurality of input signals with respective input phases of an initial set of input phases, the plurality of input signals received by the multiphase divider circuit; and
each frequency divider chain of the at least one frequency divider chain configured to produce a respective output pair of output signals by performing multiple frequency divisions of the respective input pair of input signals via the respective plurality of differential frequency dividers, one or more frequency divider chains of the at least one frequency divider chain configured to include at least one phase inversion, the at least one phase inversion located along the one or more frequency divider chains to produce the respective output pair of output signals with respective output phases from within the initial set of input phases.

2. The multiphase divider circuit of claim 1, wherein each differential frequency divider of each respective plurality of differential frequency dividers is a divide-by-two differential frequency divider.

3. The multiphase divider circuit of claim 1, wherein each respective input pair is a respective input pair of complementary input signals and each respective output pair is a respective output pair of complementary output signals.

4. The multiphase divider circuit of claim 1, wherein the at least one phase inversion is implemented by cross-connecting a) differential output terminals of a given differential frequency divider of the respective plurality of differential frequency dividers, with b) differential input terminals of a successive differential frequency divider of the respective plurality of differential frequency dividers.

5. The multiphase divider circuit of claim 4, wherein the at least one phase inversion prevents the successive differential frequency divider from producing a differential output signal from its positive output terminal with a divided output phase that is outside of the initial set of input phases.

6. The multiphase divider circuit of claim 1, wherein each differential frequency divider of each respective plurality of differential frequency dividers is configured to (i) be clocked via a rising edge of a differential input signal to its positive input terminal, (ii) produce a first differential output signal from its positive output terminal with half a number of phases relative to the differential input signal, and (iii) produce a second differential output signal from its negative output terminal, wherein the second differential output signal is a complementary signal of the first differential output signal.

7. The multiphase divider circuit of claim 1, wherein each frequency divider chain of the at least one frequency divider chain is resettable.

8. The multiphase divider circuit of claim 1, wherein the at least one frequency divider chain includes a first frequency divider chain, a second frequency divider chain, and a third frequency divider chain and wherein the multiphase divider circuit further comprises a reset signal generator, the reset signal generator configured to:
receive an external reset signal;
produce a first synchronized reset signal, derived from the external reset signal; and
produce a second synchronized reset signal, derived from the first synchronized reset signal, wherein the first frequency divider chain is configured to be reset by the first synchronized reset signal and the second divider chain and the third divider chain are configured to be reset by the second synchronized reset signal.

9. The multiphase divider circuit of claim 8, wherein:
a starting differential frequency divider of the first frequency divider chain is configured to receive a given input signal of the plurality of input signals at its positive input terminal; and
the first synchronized reset signal is synchronized to the given input signal.

10. The multiphase divider circuit of claim 9, wherein the reset signal generator includes:
dual back-to-back flip-flops (FFs), the dual back-to-back FFs including a first flip-flop (FF) and a second FF;
the first FF configured to receive the external reset signal;
the first FF and the second FF configured to be clocked by the given input signal; and
the second FF configured to produce the first synchronized reset signal.

11. The multiphase divider circuit of claim 10, wherein:
the starting differential frequency divider is a first starting differential frequency divider;
the given input signal is a first given input signal; and
the reset signal generator further includes a third FF, the third FF configured to receive the first synchronized reset signal and to be clocked by a second given input signal of the plurality of input signals to produce the second synchronized reset signal, a second starting differential frequency divider of the third divider chain configured to receive the second given input signal at its positive input terminal.

12. The multiphase divider circuit of claim 8, wherein the reset signal generator is further configured to maximize a timing margin between rising edges of the first synchronized reset signal and the second synchronized reset signal.

13. The multiphase divider circuit of claim 12, wherein the reset signal generator is configured to maximize the timing margin by:
synchronizing the external reset signal with a first input signal of the plurality of input signals to produce the first synchronized reset signal used to reset the first divider chain; and
synchronizing the first synchronized reset signal with a second input signal of the plurality of input signals to produce the second synchronized reset signal used to reset the second divider chain and the third divider chain.

14. The multiphase divider circuit of claim 12, wherein the timing margin is two-thirds of a clock period of the first input signal, a first starting differential divider of the first divider chain configured to receive the first input signal at its positive input terminal and a second starting differential divider of the third divider chain configured to receive the second input signal at its positive input terminal.

15. A method for dividing a multiphase input signal by a multiphase divider circuit, the method comprising:
receiving, at each frequency divider chain of at least one frequency divider chain of the multiphase divider circuit, a respective input pair of input signals of a plurality of input signals with respective input phases of an initial set of input phases, the plurality of input signals composing the multiphase input signal, each frequency divider chain of the at least one frequency divider chain composed of a respective plurality of differential frequency dividers;
producing a respective output pair of output signals from each frequency divider chain by performing multiple frequency divisions of the respective input pair of input signals via the respective plurality of differential frequency dividers; and
including at least one phase inversion in one or more frequency divider chains of the at least one frequency divider chain, the at least one phase inversion located along the one or more frequency divider chains for producing the respective output pair of output signals with respective output phases from within the initial set of input phases.

16. The method of claim 15, wherein each differential frequency divider of each respective plurality of differential frequency dividers is a divide-by-two differential frequency divider.

17. The method of claim 15, wherein each respective input pair is a respective input pair of complementary input signals and each respective output pair is a respective output pair of complementary output signals.

18. The method of claim 15, wherein including the at least one phase inversion includes implementing the at least one phase inversion by cross-connecting a) differential output terminals of a given differential frequency divider of the respective plurality of differential frequency dividers, with b) differential input terminals of a successive differential frequency divider of the respective plurality of differential frequency dividers.

19. The method of claim 18, wherein implementing the at least one phase inversion prevents the successive differential frequency divider from producing a differential output signal from its positive output terminal with a divided output phase that is outside of the initial set of input phases.

20. The method of claim 15, further comprising:
clocking each differential frequency divider of each respective plurality of differential frequency dividers via a rising edge of a differential input signal to its positive input terminal;
producing, by each differential frequency divider of each respective plurality of differential frequency dividers, a first differential output signal from its positive output terminal with half a number of phases relative to the differential input signal; and
producing, by each differential frequency divider of each respective plurality of differential frequency dividers, a second differential output signal from its negative output terminal, wherein the second differential output signal is a complementary signal of the first differential output signal.

21. The method of claim 15, wherein each frequency divider chain of the at least one frequency divider chain is resettable.

22. The method of claim 15, wherein the at least one frequency divider chain includes a first frequency divider chain, a second frequency divider chain, and a third frequency divider chain and wherein the multiphase divider circuit further comprises a reset signal generator and the method further comprises:
receiving an external reset signal at the reset signal generator;
producing a first synchronized reset signal by the reset signal generator, the first synchronized reset signal derived from the external reset signal;
producing a second synchronized reset signal by the reset signal generator, the second synchronized reset signal derived from the first synchronized reset signal;
resetting the first frequency divider chain via the first synchronized reset signal; and
resetting the second divider chain and the third divider chain via the second synchronized reset signal.

23. The method of claim 22, wherein producing the first synchronized reset signal includes:
receiving a given input signal of the plurality of input signals at a positive input terminal of a starting differential frequency divider of the first frequency divider chain; and
synchronizing the first synchronized reset signal to the given input signal.

24. The method of claim 23, wherein the reset signal generator includes dual back-to-back flip-flops (FFs), the dual back-to-back FFs including a first flip-flop (FF) and a second FF, and wherein producing the first synchronized reset signal includes:
receiving the external reset signal at the first FF;
clocking the first FF and the second FF by the given input signal; and producing the first synchronized reset signal at an output of the second FF.

25. The method of claim 24, wherein the starting differential frequency divider is a first starting differential frequency divider, the given input signal is a first given input signal, the reset signal generator further includes a third FF, and wherein producing the second synchronized reset signal includes:
- receiving a second given input signal of the plurality of input signals at a positive input terminal of a second starting differential frequency divider of the third divider chain;
- receiving the first synchronized reset signal at the third FF;
- clocking the third FF by the second given input signal of the plurality of input signals; and
- producing the second synchronized reset signal at an output of the third FF.

26. The method of claim 22, further comprising maximizing a timing margin between rising edges of the first synchronized reset signal and the second synchronized reset signal by the reset signal generator.

27. The method of claim 26, wherein maximizing the timing margin includes:
- synchronizing the external reset signal with a first input signal of the plurality of input signals to produce the first synchronized reset signal used to reset the first divider chain; and
- synchronizing the first synchronized reset signal with a second input signal of the plurality of input signals to produce the second synchronized reset signal used to reset the second divider chain and the third divider chain.

28. The method of claim 26, wherein the timing margin is two-thirds of a clock period of the first input signal and maximizing the timing margin further includes:
- receiving the first input signal at a positive input terminal of a first starting differential divider of the first divider chain; and
- receiving the second input signal at a positive input terminal of a second starting differential divider of the third divider chain.

* * * * *